United States Patent
Chang

(10) Patent No.: US 10,135,457 B2
(45) Date of Patent: Nov. 20, 2018

(54) SUCCESSIVE APPROXIMATION REGISTER ANALOG-DIGITAL CONVERTER HAVING A SPLIT-CAPACITOR BASED DIGITAL-ANALOG CONVERTER

(71) Applicant: SK hynix Inc., Icheon-si Gyeonggi-do (KR)

(72) Inventor: Keunjin Chang, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/821,225

(22) Filed: Nov. 22, 2017

(65) Prior Publication Data

US 2018/0269893 A1  Sep. 20, 2018

(30) Foreign Application Priority Data

Mar. 14, 2017 (KR) ........................ 10-2017-0032078

(51) Int. Cl.
*H03M 1/12* (2006.01)
*H03M 1/46* (2006.01)

(52) U.S. Cl.
CPC .................................. *H03M 1/466* (2013.01)

(58) Field of Classification Search
CPC ...... H03M 1/468; H03M 1/466; H03M 1/804; H03M 1/12; H03M 1/0682; H03M 1/1057; H03M 1/38; H03M 1/1245
USPC .................................. 341/118, 120, 155, 172
See application file for complete search history.

(56) References Cited

U.S. PATENT DOCUMENTS

| | | | |
|---|---|---|---|
| 9,319,059 B1* | 4/2016 | Sharma | H03M 1/38 |
| 2011/0148675 A1* | 6/2011 | Zhao | H03M 1/1033 341/118 |
| 2011/0215956 A1* | 9/2011 | Ishikawa | H03M 1/00 341/110 |
| 2011/0260899 A1* | 10/2011 | Snedeker | H03M 1/1047 341/118 |
| 2013/0088375 A1* | 4/2013 | Wu | H03M 1/1047 341/120 |
| 2013/0147649 A1* | 6/2013 | Cheong | H03M 1/0682 341/172 |
| 2014/0184432 A1* | 7/2014 | Huang | H03M 1/1057 341/110 |
| 2014/0285370 A1 | 9/2014 | Miki et al. | |

(Continued)

*Primary Examiner* — Linh Nguyen
(74) *Attorney, Agent, or Firm* — William Park & Associates Ltd.

(57) ABSTRACT

A successive approximation register analog-digital converter including a split-capacitor based digital-analog converter includes a comparator, a split-capacitor based digital-analog converter including a positive capacitor array and a negative capacitor array, and a successive approximation register logic. The positive capacitor array and the negative capacitor array each includes a positive capacitor array of a first stage and a negative capacitor array of a first stage that generate input signals of the comparator corresponding to upper bits including an MSB, respectively, a positive capacitor array of a second stage and a negative capacitor array of a second stage that generate input signals corresponding to intermediate bits, and a positive capacitor array of a third stage and a negative capacitor array of a third stage that generate input signals corresponding to lower bits of an LSB and a next to bit of the LSB.

18 Claims, 25 Drawing Sheets

(56) References Cited

U.S. PATENT DOCUMENTS

2015/0263756 A1* 9/2015 Chiu .................... H03M 1/468
            341/118
2016/0126967 A1* 5/2016 Oh ......................... H03M 1/06
            341/118

* cited by examiner

SUCCESSIVE APPROXIMATION REGISTER ANALOG-DIGITAL CONVERTER HAVING A SPLIT-CAPACITOR BASED DIGITAL-ANALOG CONVERTER

CROSS-REFERENCE TO RELATED APPLICATION

The present application claims priority under 35 U.S.C 119(a) to Korean Patent Application No. 10-2017-0032078, filed on Mar. 14, 2017, which is herein incorporated by reference in its entirety.

BACKGROUND

1. Technical Field

Various embodiments of the present disclosure generally relate to a successive approximation register analog-digital converter and, more particularly, to a successive approximation register analog-digital converter having a split-capacitor based digital-analog converter.

2. Related Art

Recently, a demand for lower power consumption and a smaller area in the implementation of a system on chip (SoC) has increased. In order to meet such a demand, a successive approximation register (hereinafter referred to as "SAR") structure is mainly used in designing an analog-digital converter (hereinafter referred to as "ADC") for converting an analog value to a digital value. SAR ADC is typically composed of a comparator, a digital-analog converter (hereinafter referred to as "DAC"), and a digital block and has advantages such as low power consumption, high resolution and accuracy, small chip area, and good correlation of resolution and operating speed. Also, most of the SAR ADC consume dynamic power, which has a great effect on scaling power consumption according to frequency. Therefore, in application fields requiring operation in a wide frequency range of middle and low frequencies, there are advantages in terms of power consumption as compared with a structure in which frequency scaling is not great.

The DAC used in an SAR ADC generates a reference voltage for a binary search of the SAR ADC. An example of the DAC used in the SAR ADC is a binary weighted structure. This scheme has advantages in that the structure is simple and the linearity of the DAC is good. On the other hand, due to the high total capacitance, the DAC occupies a large area, which results in an increase in the settling time and power consumption of the DAC, which is disadvantageous for high-speed operation. When the size of a MOS transistor is increased to reduce the resistance of a switch, the settlement time becomes reduced but the junction capacitor of the MOS transistor is increased.

Another example of a DAC used in an SAR ADC is a split-capacitor based DAC. This scheme has an advantage in that the total capacitance is lower than that of the binary weighted structure, thereby reducing the SAR ADC area and enabling lower power design. This scheme also has an advantage in that an SAR ADC speed is improved by reducing a delay time (RC time) generated by the digital-analog switch. However, this scheme shows a limitation in increasing the effective number of bits (hereinafter referred to as "ENOB") that can be implemented by the SAR ADC to more than a certain number of bits. For example, compared to a case where the ENOB is 10, the total capacitance required is $2^1$ times in order to increase the ENOB to 11, and the total capacitance required is $2^2$ times in order to increase the ENOB to 12.

SUMMARY

A successive approximation register analog-digital converter including a split-capacitor based digital-analog converter includes a comparator, a split-capacitor based digital-analog converter including a positive capacitor array and a negative capacitor array, and a successive approximation register logic. The positive capacitor array and the negative capacitor array each includes a positive capacitor array of a first stage and a negative capacitor array of a first stage generating input signals of the comparator corresponding to upper bits including an MSB, respectively, a positive capacitor array of a second stage and a negative capacitor array of a second stage generating input signals corresponding to intermediate bits, and a positive capacitor array of a third stage and a negative capacitor array of a third stage generating input signals corresponding to lower bits of an LSB and a bit next to the LSB.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Further, when an element is referred to as being "connected" or "coupled" to another element, the element may be electrically or mechanically connected or coupled to the other element directly, or may form a connection relationship or coupling relationship by replacing the other element therebetween.

Figure 1:
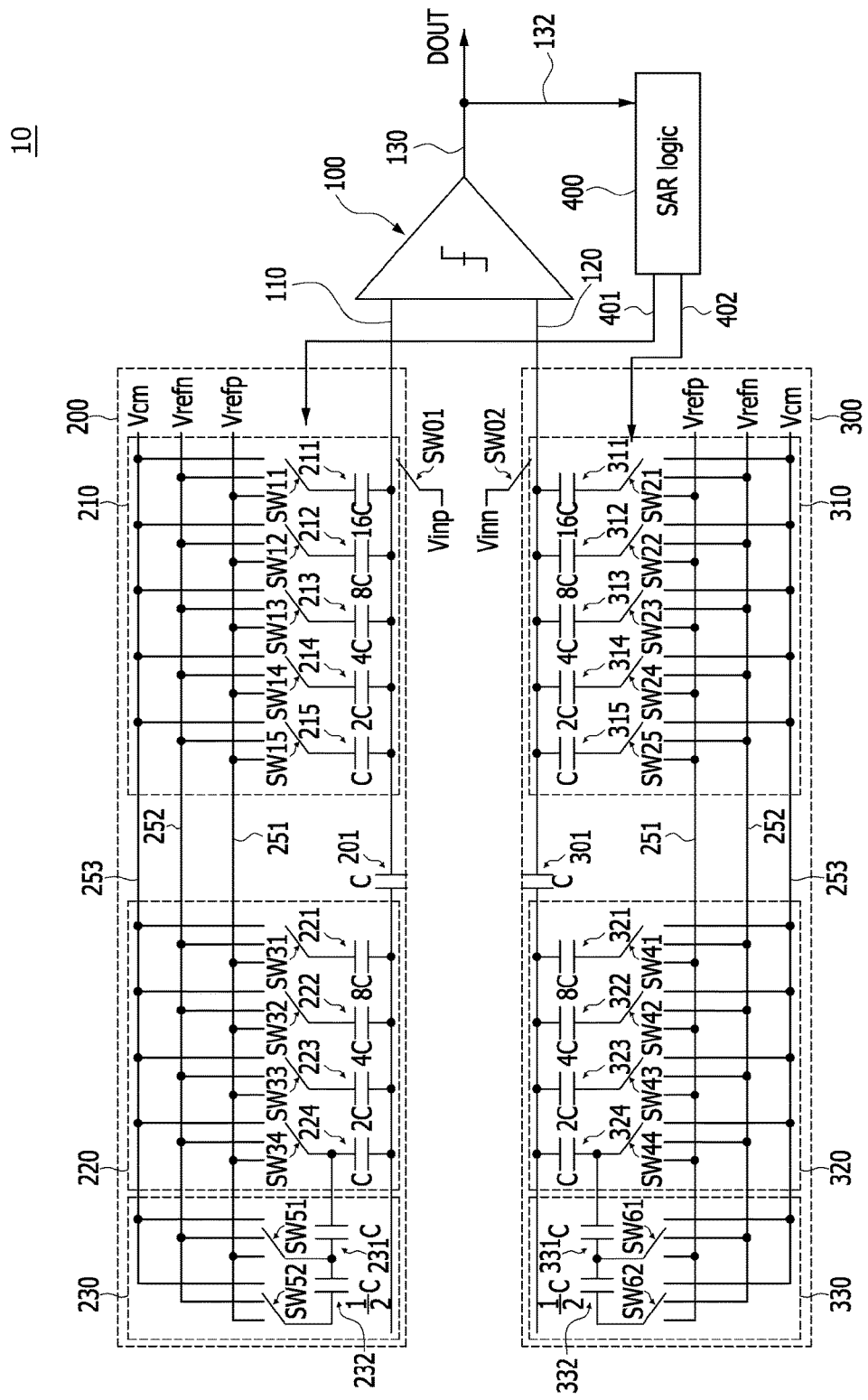
FIG. 1 is a circuit diagram illustrating an example of an SAR ADC including a split-capacitor based DAC according to an embodiment of the present disclosure.

FIG. 1 is a circuit diagram illustrating an example of an SAR ADC 10 including a split-capacitor based DAC according to an embodiment of the present disclosure. The SAR ADC 10 according to this embodiment has an ENOB of 12-bits. Referring to FIG. 1, the SAR ADC 10 including a split-capacitor based DAC according to this embodiment may include a comparator 100, a split-capacitor based DAC 200 and 300, and a SAR logic 400. The comparator 100 may include a first input terminal 110 to which a first input signal is input, and a second input terminal 120 to which a second input signal is input. The comparator 100 may also include an output terminal 130 outputting an output signal DOUT. The comparator 100 may operate as an operational amplifier. In one example, the first input terminal 110 and the second input terminal 120 may be a non-inverting terminal (+) and an inverting terminal (−), respectively. Alternatively, the first input terminal 110 and the second input terminal 120 may be an inverting terminal (−) and a non-inverting terminal (+), respectively. The comparator 100 may compare the first input signal inputted through the first input terminal 110 and the second input signal inputted through the second input terminal 120, and output a high signal or a low signal through the output terminal 130 according to the comparison result. A high signal and a low signal may be represented by binary values "1" and "0", respectively, and therefore, the output signal DOUT outputted through the output terminal 130 of the comparator 100 may constitute a bit value of a binary stream in which binary values are sequentially arranged.

The split-capacitor based DAC 200 and 300 may include a positive capacitor bank 200 and a negative capacitor bank 300. The positive capacitor bank 200 may generate the first input signal that is inputted to the first input terminal 110 of the comparator 100 in response to a first switching control signal. The negative capacitor bank 300 may generate the second input signal that is input to the second input terminal 120 of the comparator 100 in response to a second switching control signal. The positive capacitor bank 200 may include a positive capacitor array 210 of a first stage, a positive capacitor array 220 of a second stage, and a positive capacitor array 230 of a third stage. The negative capacitor bank 300 may include a negative capacitor array 310 of a first stage, a negative capacitor array 320 of a second stage, and a negative capacitor array 330 of a third stage.

The positive capacitor array 210 of the first stage and the negative capacitor array 310 of the first stage may respectively generate first input signals and second input signals used for conversion of the upper bits including the most significant bit (MSB). The positive capacitor array 210 of the first stage may include a plurality of, for example, five positive capacitors 211-215 of the first stage. The negative capacitor array 310 of the first stage may include five negative capacitors 311-315 that are equal in number to the positive capacitors 211-215 of the first stage. The number of the positive capacitors 211-215 of the first stage and the number of the negative capacitors 311-315 of the first stage may be determined based on the number of upper bits to be extracted in the positive capacitor array 210 of the first stage and the negative capacitor array 310 of the first stage. In this embodiment, the first and second input signals corresponding to the upper six bits including the MSB are respectively generated. In this case, the number of positive capacitors of the first stage and the number of the negative capacitors of the first stage are five, respectively. Thus, the positive capacitor array 210 of the first stage and the negative capacitor array 310 of the first stage each includes one less positive capacitor and one less negative capacitor, respectively, than the number of bits of the upper bits. However, this is only one example, and the number of upper bits to be extracted by the positive capacitor array 210 of the first stage and the negative capacitor array 310 of the first stage may be smaller or larger than six. In this case, the number of positive capacitors of the first stage and the number of negative capacitors of the first stage may vary. In either case, in the event that the number of upper bits to be extracted by the positive capacitor array 210 of the first stage and the negative capacitor array 310 of the first stage is "M", the number of positive capacitors of the first stage and the number of negative capacitors of the first stage become (M−1), respectively.

A first terminal of each of the positive capacitors 211-215 of the first stage may be coupled to the first input terminal 110 of the comparator 100. A second terminal of each of the positive capacitors 211-215 of the first stage may be coupled to one end of each of the positive switches SW11-SW15 of the first stage. The other end of each of the positive switches SW11-SW15 of the first stage may be coupled to one of a first voltage apply line 251, a second voltage apply line 252, and a third voltage apply line 253 in response to a first switching control signal. Accordingly, the second terminal of each of the positive capacitors 211-215 of the first stage may be coupled to one of first voltage apply line 251, a second voltage apply line 252, and a third voltage apply line 253 through a positive switch SW11-SW15 of the first stage. A first terminal of each of the negative capacitors 311-315 of the first stage may be coupled to the second input terminal 120 of the comparator 100. A second terminal of each of the negative capacitors 311-315 of the first stage may be coupled to one end of each of negative switches SW21-SW25 of the first stage. The other end of each of the negative switches SW21-SW25 of the first stage may be coupled to one of a first voltage apply line 251, a second voltage apply line 252, and a third voltage apply line 253 in response to a second switching control signal. Accordingly, a second terminal of each of the negative capacitors 311-315 of the first stage may be coupled to one of a first voltage apply line 251, a second voltage apply line 252, and a third voltage apply line 253 through a negative switch SW21-SW25 of the first stage.

A first reference voltage Vrefp, a second reference voltage Vrefn, and a common mode voltage Vcm are applied to the first voltage apply line 251, the second voltage apply line 252, and the third voltage apply line 253, respectively. In an embodiment, the first reference voltage Vrefp may be configured to a voltage equal to or less than a supply voltage VDD. The second reference voltage Vrefn may be configured to a voltage equal to or greater than a ground voltage. In either case, the first reference voltage Vrefp may be greater than the second reference voltage Vrefn. The common mode voltage Vcm may be a voltage fixed between the first reference voltage Vrefp and the second reference voltage Vrefn. In an embodiment, the common mode voltage Vcm may have an intermediate magnitude (Vrefp−Vrefn)/2 between the first reference voltage Vrefp and the second reference voltage Vrefn.

On the basis of a unit capacitance C, the first positive capacitor 211 of the first stage among the positive capacitors 211-215 of the first stage may have a capacitance 16C twice as great as the capacitance 8C of the second positive capacitor 212 of the first stage. The second positive capacitor 212 of the first stage may have a capacitance 8C twice as great as the capacitance 4C of the third positive capacitor 213 of the first stage. The third positive capacitor 213 of the first stage may have a capacitance 4C twice as great as the capacitance 2C of the fourth positive capacitor 214 of the first stage. The fourth positive capacitor 214 of the first stage may have a capacitance 2C twice as great as the capacitance C of the fifth positive capacitor 215 of the first stage. The first positive capacitor 211 of the first stage and the first negative capacitor 311 of the first stage may have the same capacitance 16C. The second positive capacitor 212 of the first stage and the second negative capacitor 312 of the first stage may have the same capacitance 8C. The third positive capacitor 213 of the first stage and the third negative capacitor 313 of the first stage may have the same capacitance 4C. The fourth positive capacitor 214 of the first stage and the fourth negative capacitor 314 of the first stage may have the same capacitance 2C. The fifth positive capacitor 215 of the first stage and the fifth negative capacitor 315 of the first stage may have the same capacitance C.

A first input voltage Vinp may be provided to the first terminal of the first positive capacitor 211 of the first stage having the greatest capacitance 16C among the positive capacitors 211-215 of the first stage through a switching operation of the first input switch SW01. A second input voltage Vinn may be provided to the first terminal of the first negative capacitor 311 of the first stage having the greatest capacitance 16C among the negative capacitors 311-315 of the first stage through a switching operation of the second input switch SW02. The first input switch SW01 and the second input switch SW02 are closed only when generating the first input signal and the second input signal used for MSB conversion, and then remain open during a conversion process for remaining bits. That is, in order to generate the first input signal and the second input signal used for MSB conversion, the first input voltage Vinp and the second input voltage Vinn are provided to the first terminal of the first positive capacitor 211 of the first stage and the first terminal of the first negative capacitor 311 of the first stage, respectively. After generating the first input signal and the second input signal used for MSB conversion, both the first input switch SW01 and the second input switch SW02 are opened.

The positive capacitor array 220 of a second stage and the negative capacitor array 320 of a second stage may generate a first input signal and a second input signal corresponding to the intermediate bits, respectively. The positive capacitor array 220 of the second stage may include first to fourth positive capacitors 221-224 of the second stage, and the negative capacitor array 320 of the second stage may include first to fourth negative capacitors 321-324 of the second stage. The number of first to fourth positive capacitors 221-224 of the second stage and the number of first to fourth negative capacitors 321-324 of the second stage are the same, and the numbers may match the number of intermediate bits to be extracted in the positive capacitor array 220 of the second stage and the negative capacitor array 320 of the second stage. In this embodiment, the first and second input signals used for conversion of the intermediate four bits may be respectively generated, and in this case, the number of positive capacitors of the second stage and the number of negative capacitors of the second stage may be four. However, this is only one example, and the number of the intermediate bits to be extracted by the positive capacitor array 220 of the second stage and the negative capacitor array 320 of the second stage may be smaller or larger than four. In this case, the number of positive capacitors of the second stage and the number of negative capacitors of the second stage may be similarly varied.

A positive capacitor array 220 of the second stage may be coupled to the positive capacitor array 210 of the first stage through a positive attenuation capacitor 201. In detail, a first terminal of each of the positive capacitors 221-224 of the second stage may be coupled to the first input terminal 110 of the comparator 100 through the positive attenuation capacitor 201. A second terminal of each of the positive capacitors 221-224 may be coupled to one end of each of positive switches SW31-SW34 of the second stage, respectively. The other end of each of the positive switches SW31-SW34 of the second stage may be coupled to one of the first voltage apply line 251, the second voltage apply line 252, and the third voltage apply line 253, respectively in response to the first switching control signal. Accordingly, the second terminal of each of the positive capacitors 221-224 may be coupled to one end of the first voltage apply line 251, the second voltage apply line 252, and the third voltage apply line 253 through a positive switch SW31-SW34 of the second stage. The negative capacitor array 320 of the second stage may be coupled to the negative capacitor array 310 of the first stage through a negative attenuation capacitor 301. In detail, a first terminal of each of the negative capacitors 321-324 of the second stage may be coupled to the second input terminal 120 of the comparator 100 through the negative attenuation capacitor 301. A second terminal of each of the negative capacitors 321-324 may be coupled to one end of each of negative switches SW41-SW44 of the second stage, respectively. The other end of each of the negative switches SW41-SW44 of the second stage may be coupled to one of the first voltage apply line 251, the second voltage apply line 252, and the third voltage apply line 253 in response to the second switching control signal. Accordingly, a second terminal of each of the negative capacitors 321-324 of the second stage may be coupled to one of the first voltage apply line 251, the second voltage apply line 252, and the third voltage apply line 253 through a negative switch SW41-SW44 of the second stage.

The positive attenuation capacitor 201 may have the same capacitance C as the capacitance C of the fifth positive capacitor 215 of the first stage having the smallest capacitance among the positive capacitors of the first stage. The negative attenuation capacitor 301 may have the same capacitance C as the capacitance C of the positive attenuation capacitor 201. The first positive capacitor 221 of the second stage among the positive capacitors 221-224 of the second stage may have a capacitance 8C twice as great as the capacitance 4C of the second positive capacitor 222 of the second stage. The second positive capacitor 222 of the second stage may have a capacitance 4C twice as great as the capacitance 2C of the third positive capacitor 223 of the second stage. The third positive capacitor 223 of the second stage may have a capacitance 2C twice as great as the capacitance C of the fourth positive capacitor 224 of the second stage. The first positive capacitor 221 of the second stage and the first negative capacitor 321 of the second stage may have the same capacitance 8C. The second positive capacitor 222 of the second stage and the second negative capacitor 322 of the second stage may have the same capacitance 4C. The third positive capacitor 223 of the second stage and the third negative capacitor 323 of the second stage may have the same capacitance 2C. The fourth positive capacitor 224 of the second stage and the fourth negative capacitor 324 of the second stage may have the same capacitance C.

A positive capacitor array 230 of a third stage and a negative capacitor array 330 of a third stage may generate a first input signal and a second input signal, respectively, which are used for conversion of lower bits, i.e., a least significant bit (LSB) and a bit next to the LSB. The positive capacitor array 230 of the third stage may include first and second positive capacitors 231 and 232 of the third stage, and the negative capacitor array 330 of a third stage may include first and second negative capacitors 331 and 332 of the third stage. The first positive capacitor 231 of the third stage and the first negative capacitor 331 of the third stage may generate the first input signal and the second input signal used for conversion of the bits next to the LSB. The second positive capacitor 232 of the third stage and the second negative capacitor 332 of the third stage may generate the first input signal and the second input signal used for conversion of the LSB.

The positive capacitor array 230 of the third stage and the negative capacitor array 330 of the third stage may be respectively coupled in series to the positive capacitor array 220 of the second stage and the negative capacitor array 320 of the second stage. A first terminal of the first positive capacitor 231 of the third stage may be coupled to the second terminal of the fourth positive capacitor 224 of the second stage. A second terminal of the first positive capacitor 231 of the third stage may be coupled to the first terminal of the second positive capacitor 232 of the third stage and one end of a first positive switch SW51 of the third stage. A second terminal of the second positive capacitor 232 of the third stage may be coupled to one end of a second positive switch SW52 of the third stage. The other end of the first positive switch SW51 of the third stage and the other end of the second positive switch SW52 of the third stage may be coupled to one of the first voltage apply line 251, the second voltage apply line 252 and the third voltage apply line 253, respectively in response to the first switching control signal. Accordingly, the second terminal of the first positive capacitor 231 of the third stage may be coupled to one of the first voltage apply line 251, the second voltage apply line 252, and the third voltage apply line 253 through the first positive switch SW51 of the third stage. Further, the second terminal of the second positive capacitor 232 of the third stage may be coupled to one of the first voltage apply line 251, the second voltage apply line 252, and the third voltage apply line 253 through the second positive switch SW52 of the third stage. In much the same manner as described with the positive capacitor array 230 of the third stage, a second terminal of the first negative capacitor 331 of the third stage may be coupled to one of the first voltage apply line 251, the second voltage apply line 252, and the third voltage apply line 253 through a first negative switch SW61 of the third stage. Further, a second terminal of the second negative capacitor 332 of the third stage may be coupled to one of the first voltage apply line 251, the second voltage apply line 252, and the third voltage apply line 253 through a second negative switch SW62 of the third stage.

The first positive capacitor 231 of the third stage may have the same capacitance C as the capacitance C of the fourth positive capacitor 224 of the second stage, which has the smallest capacitance among the positive capacitors of the second stage. The second positive capacitor 232 of the third stage may have a capacitance C/2 that is half the capacitance C of the first positive capacitor 231 of the third stage. The first negative capacitor 331 of the third stage may have the same capacitance C as the capacitance C of the first positive capacitor 231 of the third stage. The second negative capacitor 332 of the third stage may have the same capacitance C/2 as the capacitance C/2 of the second positive capacitor 232 of the third stage.

The SAR logic 400 may receive an output signal outputted from the output terminal 130 of the comparator 100 and generate the first switching control signal and the second switching control signal through a first feedback control line 401 and a second feedback control line 402, respectively. Accordingly, the successive approximation register logic 400 may vary the first input signal from the positive capacitor bank 200 and the second input signal from the negative capacitor bank 300 in response to the output signal DOUT of the comparator 100. By the first switching control signal, switching operations of the positive switches SW11-SW15 of the first stage, the positive switches SW31-SW34 of the second stage, and the positive switches SW51, SW52 of the third stage may be controlled. Also, by the second switching control signal, switching operations of the negative switches SW21-SW25 of the first stage, the negative switches SW41-SW44 of the second stage, and the negative switches SW61, SW62 of the third stage may be controlled. With this switching control operations, the output signal from the comparator 100 outputted for conversion of any one bit may determine an operation of the split-capacitor based DAC 200 and 300 in a conversion process of the next bit.

According to the SAR ADC 10 having the split-capacitor based DAC according to this embodiment, an ADC operation of 10-bits can be implemented by the positive capacitor array 210 and the negative capacitor array 310 of the first stage, and the positive capacitor array 220 and the negative capacitor array 320 of the second stage. Also, an ADC operation for the LSB and the lower bits next the LSB can be implemented by the positive capacitor array 230 and the negative capacitor array 330 of the third stage. Generally, in a SAR ADC structure with a split-capacitor based DAC, the total capacitance required to implement an ADC operation for 10 bits is 94 C. In order to implement an ADC operation for 12 bits in the structure, the total capacitance of 376 C, which is $2^2$ times of 94 C, is required. However, the SAR ADC 10 having a split-capacitor based DAC according to this embodiment, only the capacitance of 3 C is added to configure the positive capacitor array 230 of the third stage and the negative capacitor array 330 of the third stage, so that an ADC operation of 12 bits can be implemented with only a total capacitance of 97C.

FIGS. 2 to 13 are views illustrating conversion operations for upper bits among conversion operations for 12 bits of an SAR ADC having a split-capacitor based DAC according to an embodiment of the present disclosure. Particularly, FIGS. 3, 5, 7, 9, 11, and 13 are views illustrating a process of determining the comparator output signal in the conversion operations for the upper bits of FIGS. 2, 4, 6, 8, 10, and 12. In FIGS. 2 to 13, the same reference numerals as those of FIG. 1 denote the same elements.

Figure 2:
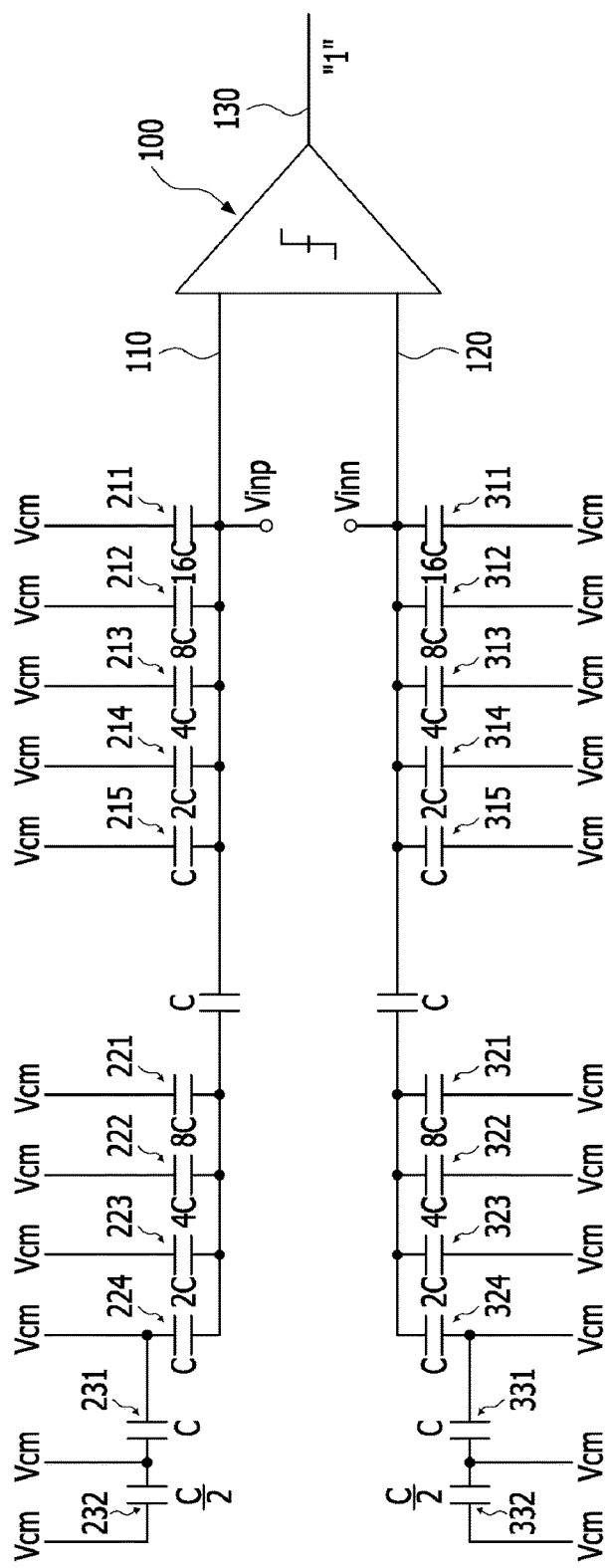
FIGS. 2 to 13 are views illustrating conversion operations for upper bits among 12-bit conversion operations of an SAR ADC including a split-capacitor based DAC according to an embodiment of the present disclosure.
Figure 3:
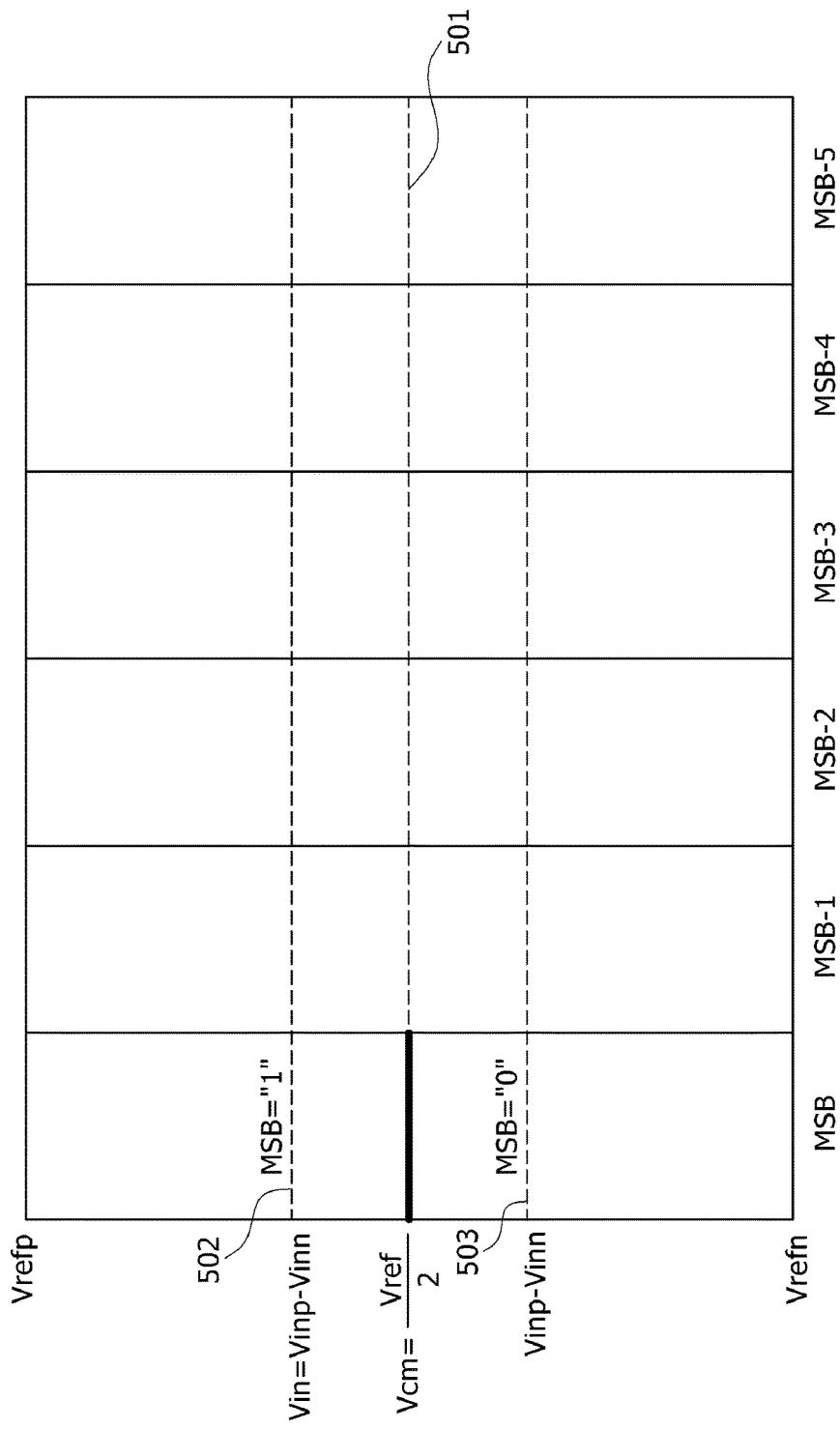

Referring to FIGS. 2 and 3, in order to obtain an MSB for an input signal, a first input switch (SW01 of FIG. 1) and a second input switch (SW02 of FIG. 1) may be closed. Then, a first input voltage Vinp may be applied to a first terminal of a first positive capacitor 211 of a first stage and a second input voltage Vinn may be applied to a first terminal of a first negative capacitor 311 of a first stage. Switching operations of positive switches (SW11-SW15 of FIG. 1) of the first stage, negative switches (SW21-SW25 of FIG. 1) of the first stage, positive switches (SW31-SW34 of FIG. 1) of a second stage, negative switches (SW41-SW44 of FIG. 1) of a second stage, positive switches (SW51, SW52 of FIG. 1) of a third stage, and negative switches (SW61, SW62 of FIG. 1) of a third stage may control a common mode voltage Vcm to be applied to second terminals of all the remaining capacitors. In this embodiment, the common mode voltage Vcm may be configured to an intermediate level voltage between a first reference voltage Vrefn and a second reference voltage V refp.

A first input signal corresponding to an amount of charge charged to positive capacitors 211-215 of the first stage may be inputted to a first input terminal 110 of a comparator 100, and a second input signal corresponding to an amount of charge charged to negative capacitors 311-315 may be inputted to a second input terminal 120 of the comparator 100. A potential equal to a difference between the first input voltage Vinp and the common mode voltage Vcm may be applied to both ends of the positive capacitors 211-215 of the first stage. On the other hand, a potential equal to a difference between the second input voltage Vinn and the common mode voltage Vcm may be applied to both ends of the negative capacitors 311-315 of the first stage. Accordingly, a difference between the first input signal and the second input signal that are respectively inputted to the first input terminal 110 and the second input terminal 120 of the comparator 110 may be proportional to a difference Vinp-Vinn (hereinafter, referred to as "analog input voltage Vin") of the first input voltage Vinp and the second input voltage Vinn.

The value of the MSB for the analog input voltage Vin may be determined by comparing the analog input voltage Vin inputted to the comparator 100 with the common mode voltage Vcm. The common mode voltage Vcm may be equal to half ((Vrefp−Vrefn)/2) the difference of (Vrefp−Vrefn) (hereinafter referred to as "reference voltage Vref") between a first reference voltage and a second reference voltage, i.e., a half of the reference voltage Vref/2. Accordingly, as illustrated in FIG. 3, in the case that the analog input voltage Vin is greater than half the reference voltage Vref/2, i.e., the analog input voltage Vin indicated by a dotted line 502 is located above a half of the reference voltage Vref/2 indicated by the dotted line 501, the comparator 100 may output "1" as the MSB value of the analog input voltage Vin. On the other hand, in the case that the analog input voltage Vin is less than half the reference voltage Vref/2, i.e., the analog input voltage Vin indicated by a dotted line 503 is located below half the reference voltage Vref/2 indicated by the dotted line 501, the comparator 100 may output "0" as the MSB value of the analog input voltage Vin. Hereinafter, the case where the analog input voltage Vin is greater than half the reference voltage ½Vref, i.e., the MSB value is "1", will be described as a reference.

Figure 4:
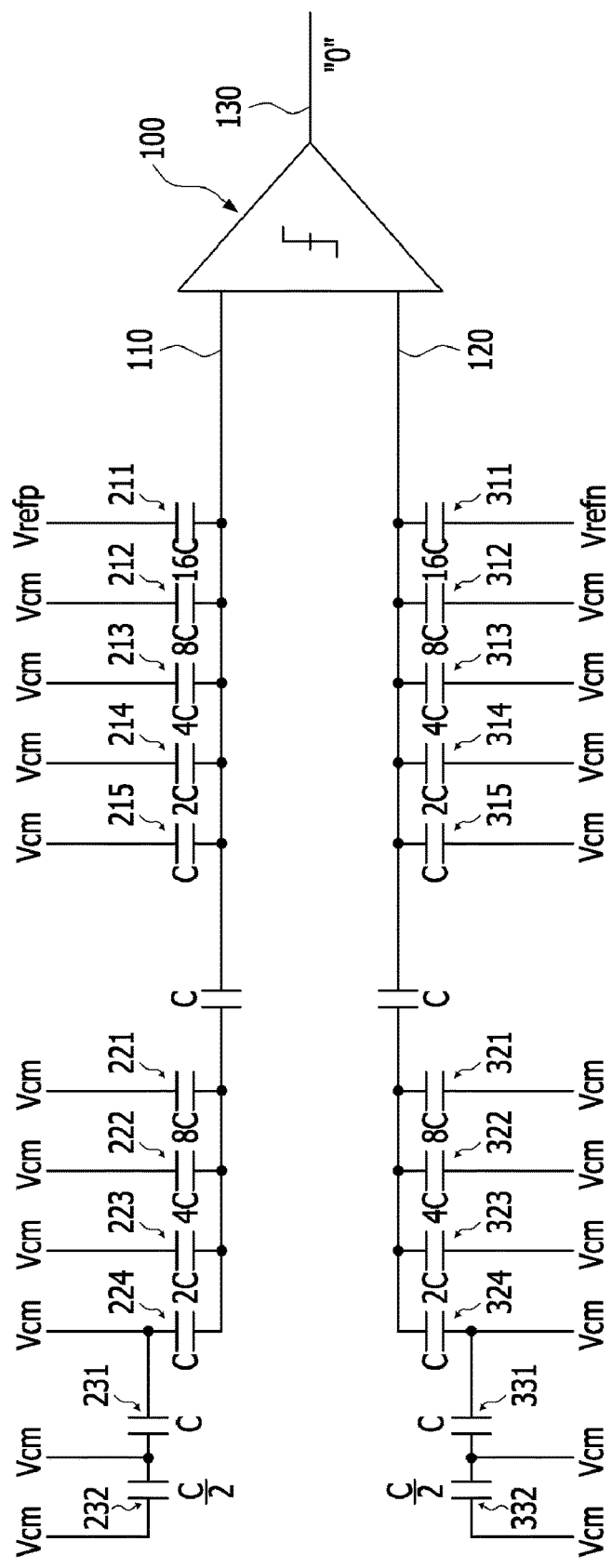
Figure 5:
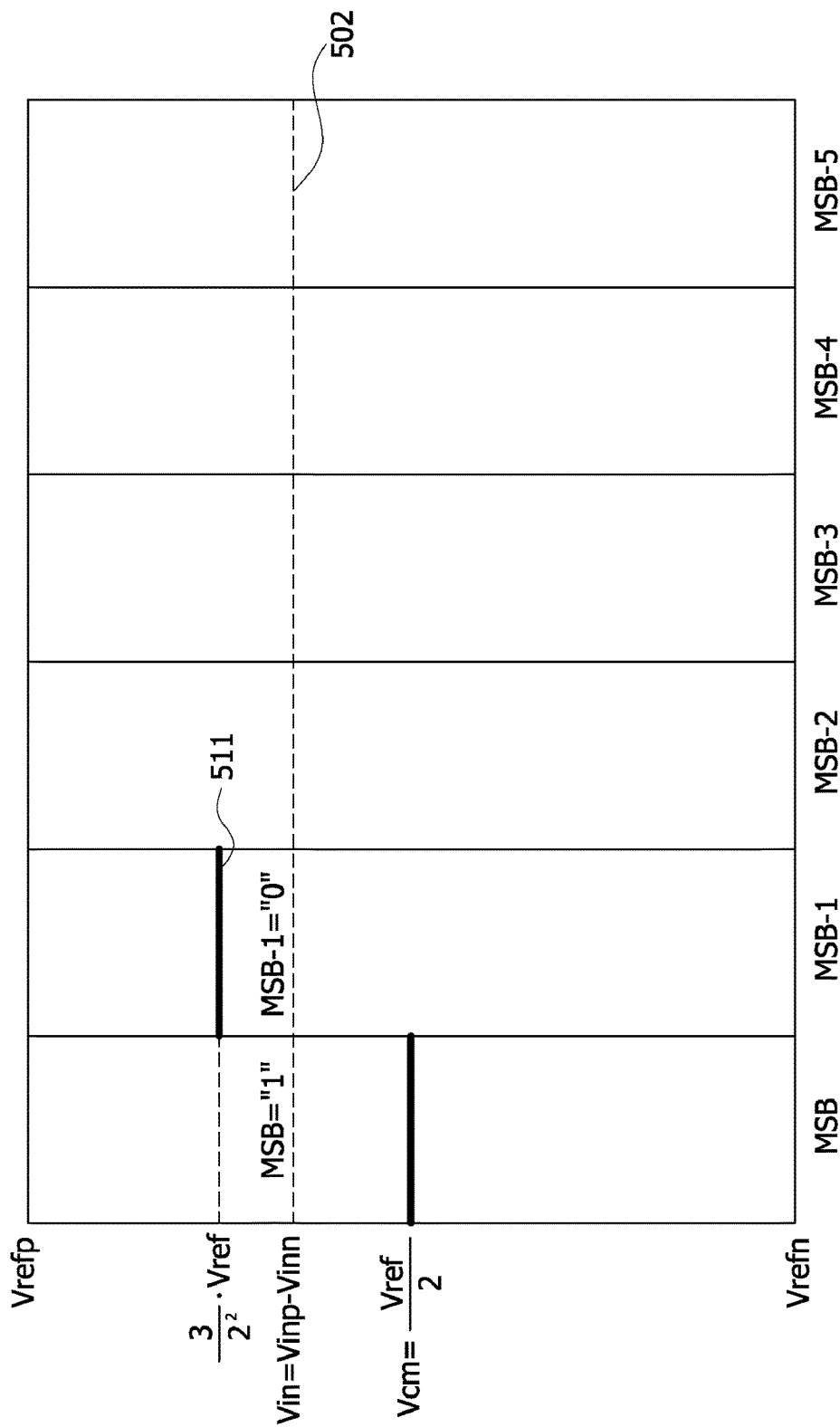

Referring to FIGS. 4 and 5, in order to obtain a value of the first MSB (MSB-1 bit value) for the analog input voltage Vin, the MSB value output from the comparator 100 may be inputted to the SAR logic 400. The SAR logic 400 may provide a first switching control signal and a second switching control signal to the positive capacitor bank 200 and the negative capacitor bank 300, respectively, according to the inputted output value of the comparator 100. As in the above example, in the case that the MSB value outputted from the comparator 100 is "1", i.e., when the analog input voltage Vin is greater than half the reference voltage Vref/2, the first switching control signal and the second switching control signal may be generated so that the reference voltage may be increased. In order to increase the reference voltage, the first switching control signal may control a switching operation to apply the first reference voltage Vrefp to the second terminal of the first positive capacitor 211 of the first stage. In addition, the second switching control signal may control a switching operation to apply the second reference voltage Vrefn to the second terminal of the first negative capacitor 311 of the first stage.

As the first reference voltage Vrefp is applied to the second terminal of the first positive capacitor 211 of the first stage and the second reference voltage Vrefn is applied to the second terminal of the first negative capacitor 311 of the first stage, the (MSB-1) bit value may be determined by comparing the analog input voltage Vin with a newly configured reference voltage (hereinafter referred to as "(MSB-1) bit reference voltage"). The (MSB-1) bit reference voltage may have a magnitude of an intermediate value $(3/2^2)*Vref$ between the first reference voltage Vrefp and the common mode voltage Vcm. As illustrated in FIG. 5, in the case that the (MSB-1) bit reference voltage $(3/2^2)*Vref$ is greater than the analog input voltage Vin, i.e., when the (MSB-1) bit reference voltage $(3/2^2)*Vref$ indicated by the solid line 511 is above the analog input voltage Vin indicated by the dotted line 502, the comparator 100 may output "0" as the (MSB-1) bit value for the analog input voltage Vin. Although it is not illustrated, in the case that the (MSB-1) bit reference voltage $(3/2^2)*Vref$ is less than the analog input voltage Vin, i.e., when the (MSB-1) bit reference voltage $((3/2^2)*Vref)$ is below the analog input voltage Vin, the comparator 100 may output "1" as the (MSB-1) bit value for the analog input voltage Vin.

Figure 6:
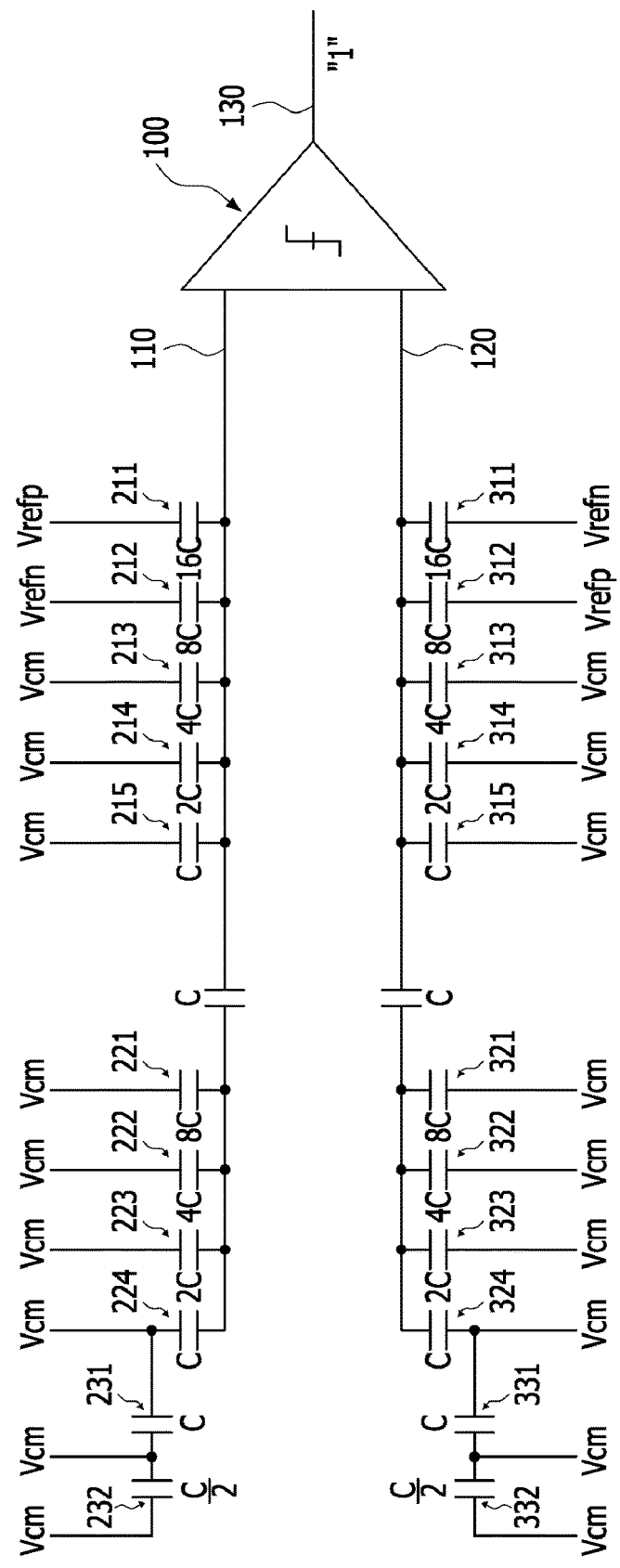
Figure 7:
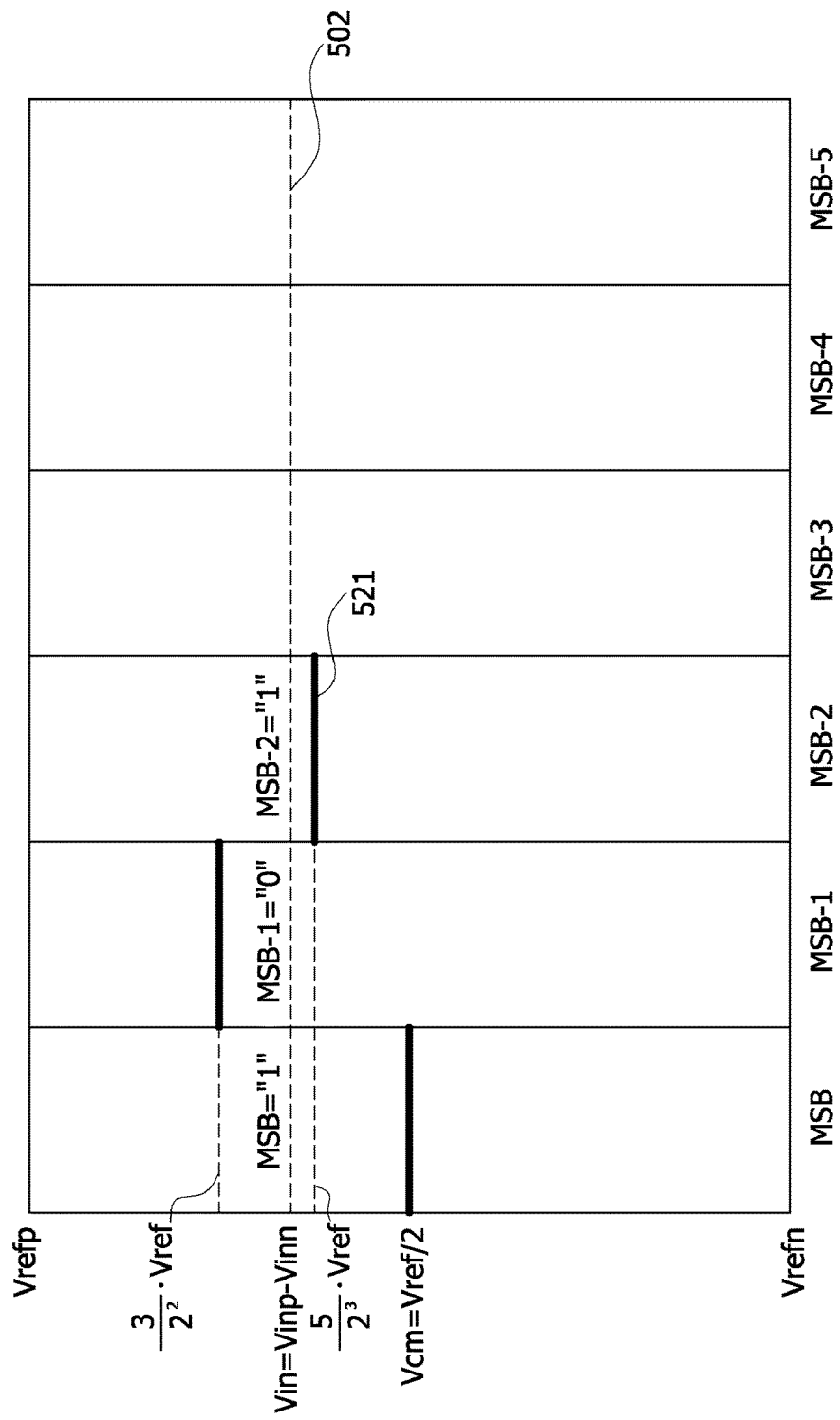

Referring to FIGS. 6 and 7, in order to obtain an (MSB-2) bit value for the analog input voltage Vin, the (MSB-1) bit value "0" outputted from the comparator 100 may be inputted to the SAR logic 400. The SAR logic 400 may provide a first switching control signal and a second switching control signal to the positive capacitor bank 200 and the negative capacitor bank 300, respectively, in response to the inputted output value "0" of the comparator 100. As in the above example, in the case that the (MSB-1) bit value outputted from the comparator 100 is "0", i.e., when the analog input voltage Vin is greater than half the reference voltage $(3/2^2)*Vref$ of the (MSB-1) bit, the first switching control signal and the second switching control signal may be generated so that the reference voltage is decreased. In order to decrease the reference voltage, the first switching control signal may control a switching operation to apply the second reference voltage Vrefn to the second terminal of the second positive capacitor 212 of the first stage. In addition, the second switching control signal may control a switching operation to apply the first reference voltage Vrefp to the second terminal of the second negative capacitor 312 of the first stage.

As the second reference voltage Vrefn is applied to the second terminal of the second positive capacitor 212 of the first stage and the first reference voltage Vrefp is applied to the second terminal of the second negative capacitor 312 of the first stage, the (MSB-2) bit value may be determined by comparing the analog input voltage Vin with an (MSB-2) bit reference voltage. The (MSB-2) bit reference voltage may have a magnitude of an intermediate value $(5/2^2)*Vref$ between the (MSB-1) bit reference voltage $(3/2^2)*Vref$ and the common mode voltage Vcm. As illustrated in FIG. 7, in the case that the analog input voltage Vin is greater than the (MSB-2) bit reference voltage $(5/2^2)*Vref$, i.e., when the analog input voltage Vin indicated by the dotted line 502 is above the (MSB-2) bit reference voltage $(5/2^2)*Vref$ indicated by the solid line 521, the comparator 100 may output "1" as the (MSB-2) bit value of the analog input voltage Vin.

Figure 8:
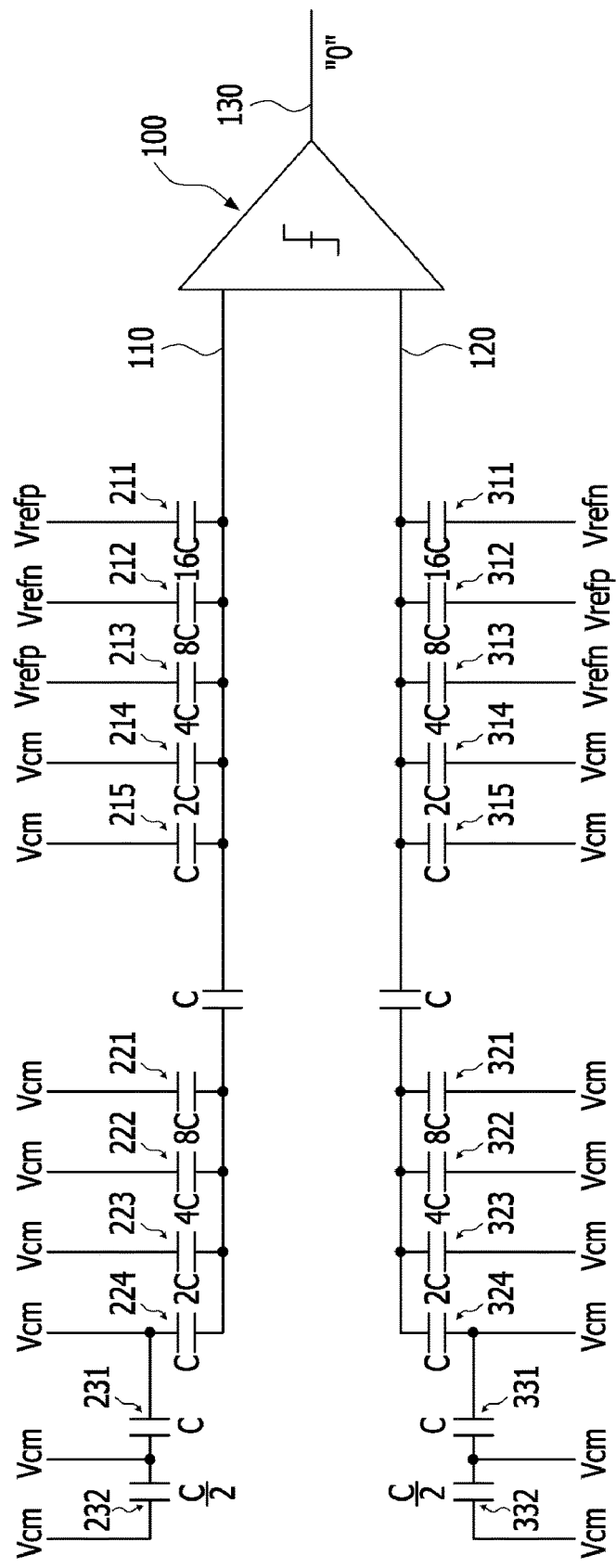
Figure 9:
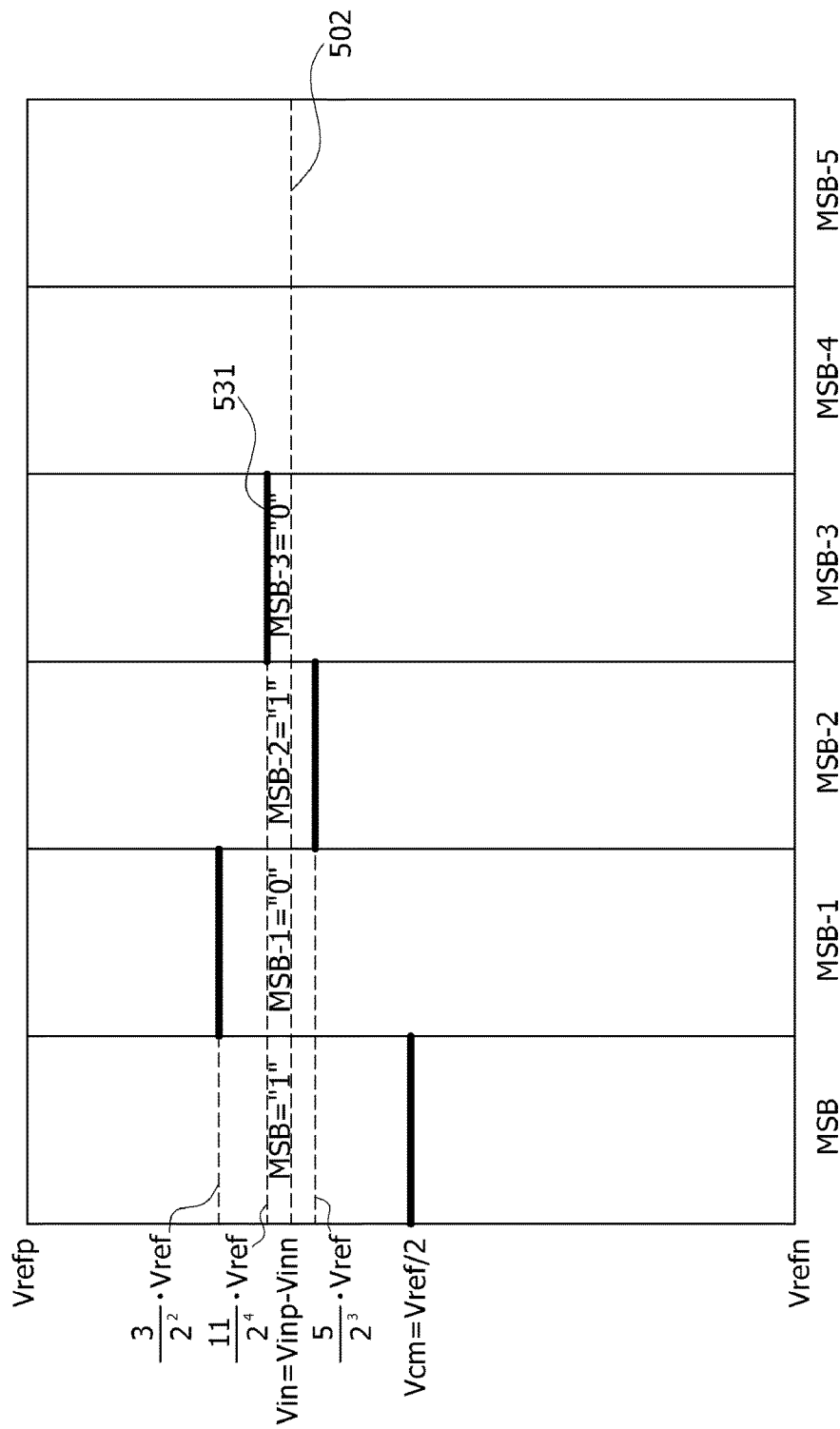

Referring to FIGS. 8 and 9, in order to obtain an (MSB-3) bit value for the analog input voltage Vin, the (MSB-2) bit value "1" outputted from the comparator 100 may be inputted to the SAR logic 400. The SAR logic 400 may provide a first switching control signal and a second switching control signal to the positive capacitor bank 200 and the negative capacitor bank 300, respectively, in response to the inputted output value "1" of the comparator 100. As in the above example, in the case that the (MSB-2) bit value outputted from the comparator 100 is "1", i.e., when the analog input voltage Vin is greater than the (MSB-2) bit reference voltage $(5/2^3)*Vref$, a first switching control signal and a second switching control signal are generated so that the reference voltage is increased. In order to increase the reference voltage, the first switching control signal may control a switching operation to apply the first reference voltage Vrefp to the second terminal of the third positive capacitor 213 of the first stage. In addition, the second switching control signal may control a switching operation to apply the second reference voltage Vrefn to the second terminal of the third negative capacitor 313 of the first stage.

As the first reference voltage Vrefp is applied to the second terminal of the third positive capacitor 213 of the first stage and the second reference voltage Vrefn is applied to the second terminal of the third negative capacitor 313 of the first stage, the (MSB-3) bit value may be determined by comparing the analog input voltage Vin with an (MSB-3) bit reference voltage. The (MSB-3) bit reference voltage may have a magnitude $(11/2^4)$*Vref of an intermediate value between the (MSB-1) bit reference voltage $(3/2^2)$*Vref and the (MSB-2) bit reference voltage $(5/2^3)$*Vref. As illustrated in FIG. 9, in the case that the analog input voltage Vin is greater than the (MSB-3) bit reference voltage $(11/2^4)$*Vref, i.e., when the analog input voltage Vin indicated by the dotted line 502 is above the (MSB-3) bit reference voltage $(11/2^4)$*Vref indicated by the solid line 531, the comparator 100 may output "0" as the (MSB-3) bit value for the analog input voltage Vin.

Figure 10:
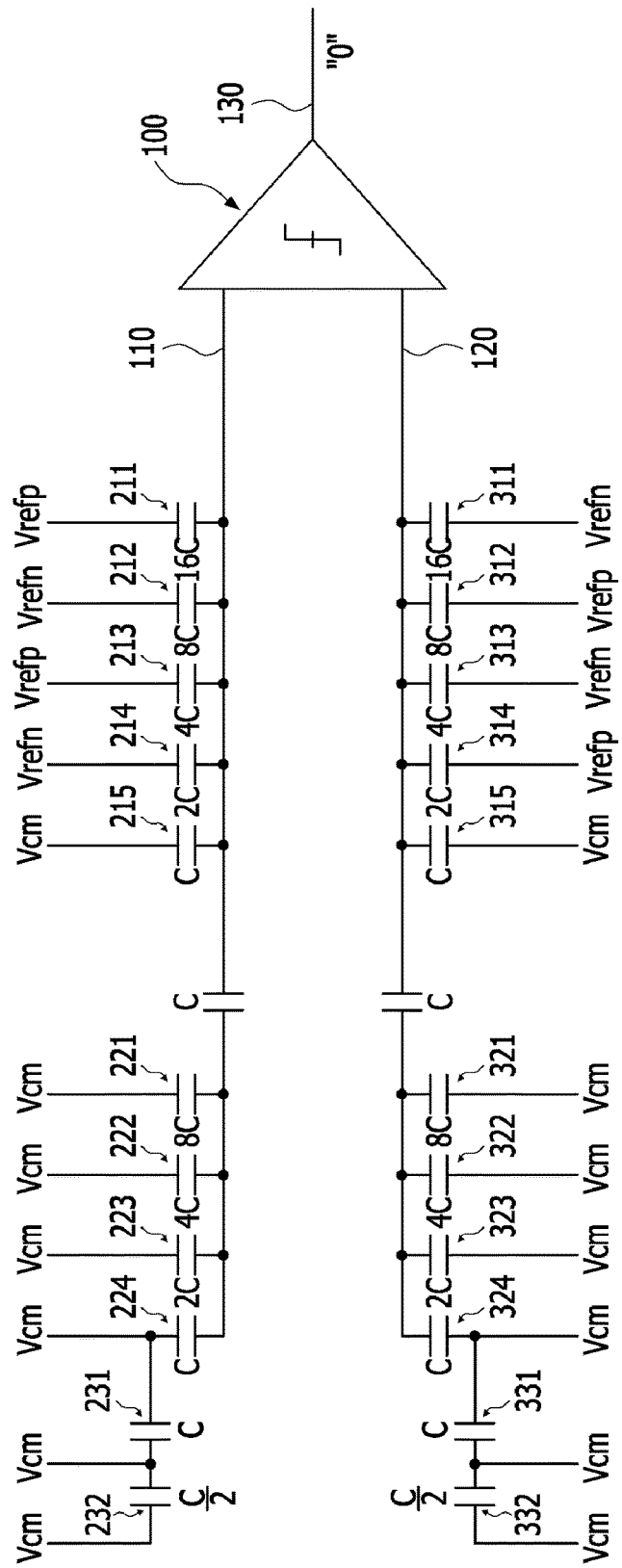
Figure 11:
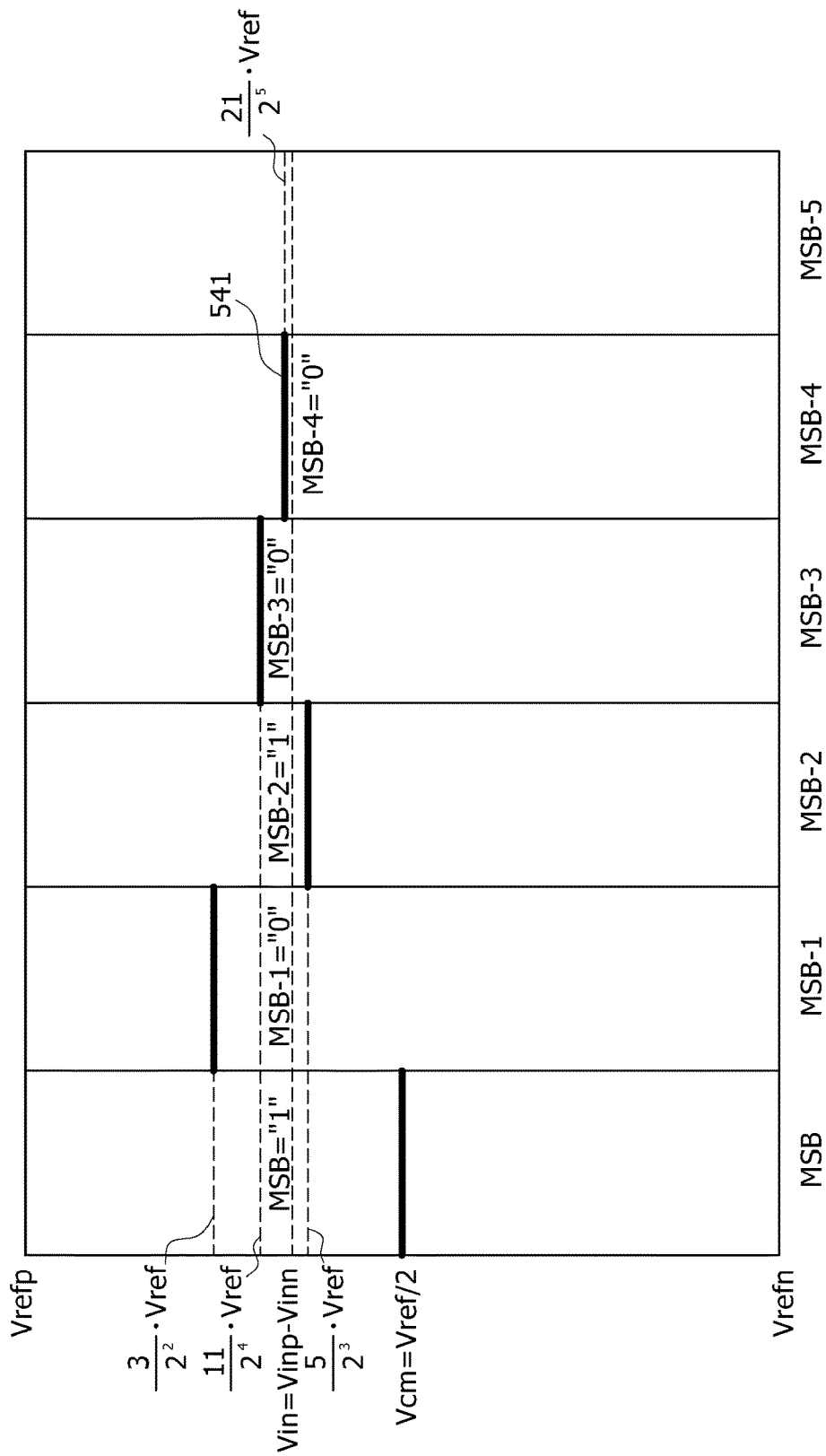

Referring to FIGS. 10 and 11, in order to obtain an (MSB-4) bit value for the analog input voltage Vin, the (MSB-3) bit value "0" outputted from the comparator 100 may be inputted to the SAR logic 400. The SAR logic 400 may provide a first switching control signal and a second switching control signal to the positive capacitor bank 200 and the negative capacitor bank 300, respectively, in response to the inputted output value "0" of the comparator 100. As in the above example, in the case that the (MSB-3) bit value outputted from the comparator 100 is "0", i.e., when the analog input voltage Vin is less than the (MSB-3) bit reference voltage $(11/2^4)$*Vref, a first switching control signal and a second switching control signal are generated so that the reference voltage is decreased. In order to decrease the reference voltage, the first switching control signal may control a switching operation to apply the second reference voltage Vrefn to the second terminal of the fourth positive capacitor 214 of the first stage. In addition, the second switching control signal may control a switching operation to apply the first reference voltage Vrefp to the second terminal of the fourth negative capacitor 314 of the first stage.

As the second reference voltage Vrefn is applied to the second terminal of the fourth positive capacitor 214 of the first stage and the first reference voltage Vrefp is applied to the second terminal of the fourth negative capacitor 314 of the first stage, the (MSB-4) bit value may be determined by comparing the analog input voltage Vin with an (MSB-4) bit reference voltage. The (MSB-4) bit reference voltage may have a magnitude $(21/2^5)$*Vref of an intermediate value between the (MSB-2) bit reference voltage $(5/2^3)$*Vref and the (MSB-3) bit reference voltage $(11/2^4)$*Vref. As illustrated in FIG. 11, in the case that the analog input voltage Vin is less than the (MSB-4) bit reference voltage $(21/2^5)$*Vref, i.e., when the analog input voltage Vin indicated by the dotted line 502 is below the (MSB-4) bit reference voltage $(21/2^5)$*Vref indicated by the solid line 541, the comparator 100 may output "0" as the (MSB-4) bit value of the analog input voltage Vin.

Figure 12:
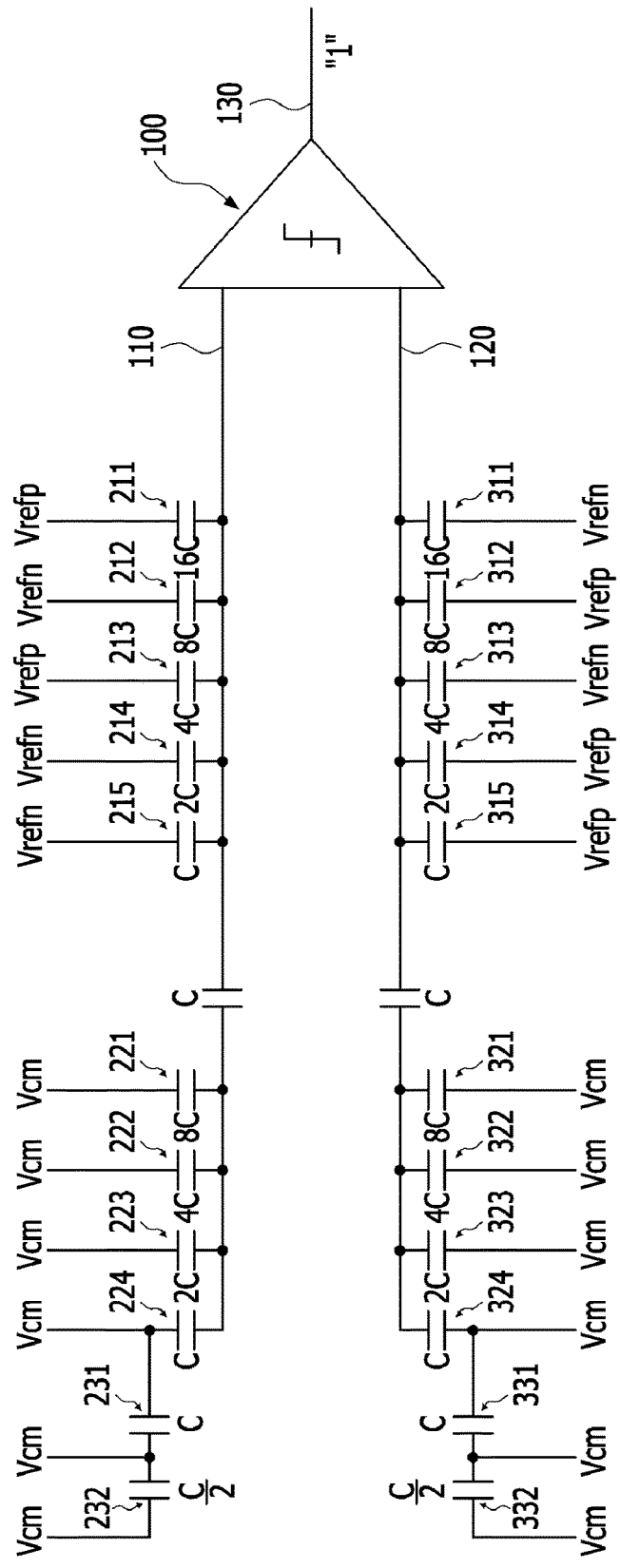
Figure 13:
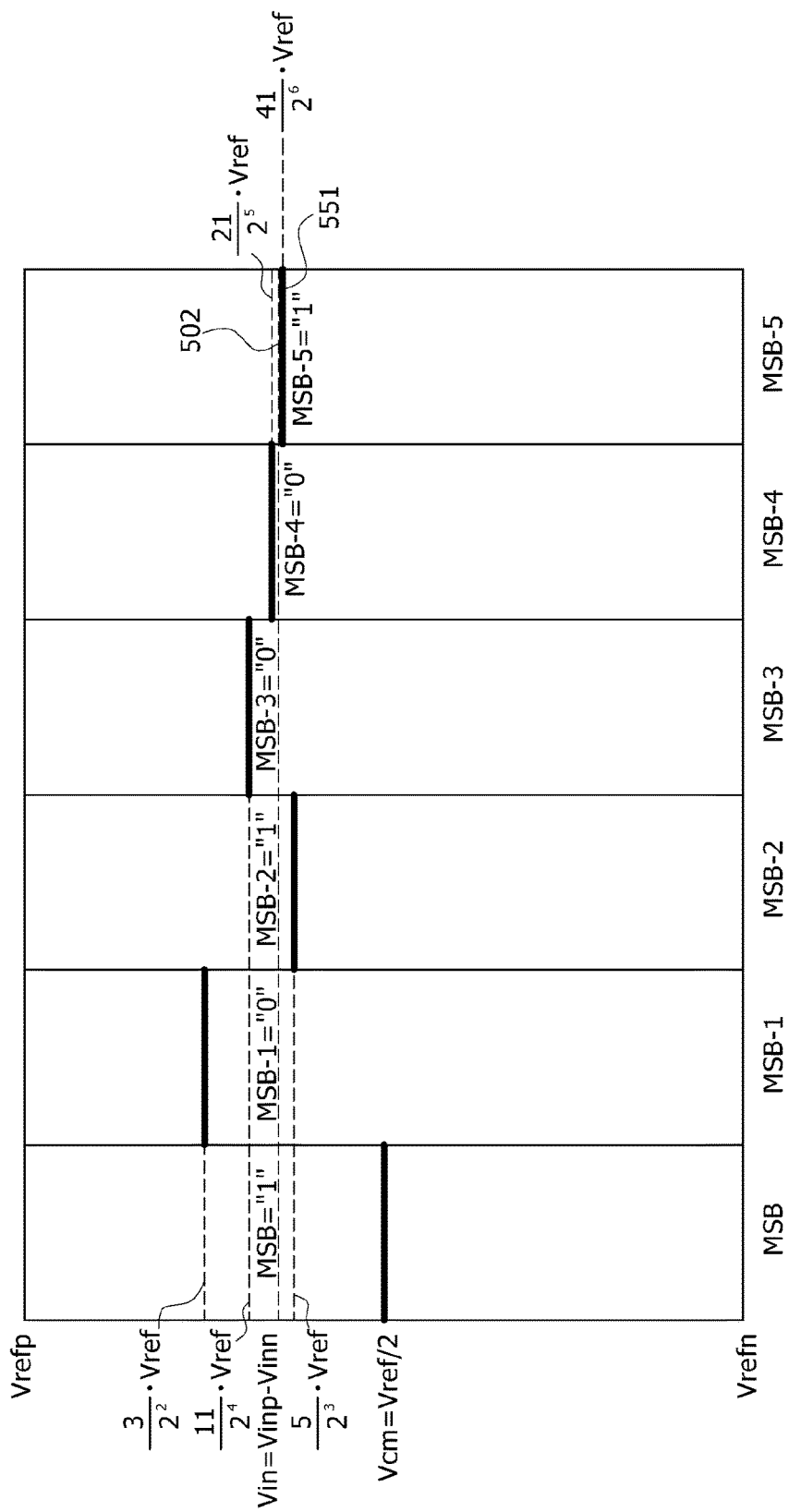

Referring to FIGS. 12 and 13, in order to obtain an (MSB-5) bit value for the analog input voltage Vin, the (MSB-4) bit value "0" outputted from the comparator 100 may be inputted to the SAR logic 400. The SAR logic 400 may provide a first switching control signal and a second switching control signal to the positive capacitor bank 200 and the negative capacitor bank 300, respectively, in response to the inputted output value "0" of the comparator 100. As in the above example, in the case that the (MSB-4) bit value outputted from the comparator 100 is "0", i.e., when the analog input voltage Vin is less than the (MSB-4) bit reference voltage $(21/2^5)$*Vref, a first switching control signal and a second switching control signal are generated so that the reference voltage is decreased. In order to decrease the reference voltage, the first switching control signal may control a switching operation to apply the second reference voltage Vrefn to the second terminal of the fifth positive capacitor 215 of the first stage. In addition, the second switching control signal may control a switching operation to apply the first reference voltage Vrefp to the second terminal of the fifth negative capacitor 315 of the first stage.

As the second reference voltage Vrefn is applied to the second terminal of the fifth positive capacitor 215 of the first stage and the first reference voltage Vrefp is applied to the second terminal of the fifth negative capacitor 315 of the first stage, the (MSB-5) bit value may be determined by comparing the analog input voltage Vin with an (MSB-5) bit reference voltage. The (MSB-5) bit reference voltage may have a magnitude $(41/2^6)$*Vref obtained by subtracting a half of the deviation of the (MSB-3) bit reference voltage $(11/2^4)$*Vref and the (MSB-4) bit reference voltage $(21/2^5)$*Vref from the (MSB-4) bit reference voltage $(21/2^5)$*Vref. As illustrate in FIG. 13, in the case that the analog input voltage Vin is greater than the (MSB-5) bit reference voltage $(41/2^6)$*Vref, i.e., when the analog input voltage Vin indicated by the dotted line 502 is above the (MSB-5) bit reference voltage $(41/2^6)$*Vref indicated by the solid line 551, the comparator 100 may output "1" as the (MSB-5) bit value for the analog input voltage Vin.

Up to now, the value "101001" has been obtained as a binary value of the upper 6 bits including the MSB through a binary search method using the positive capacitor array 210 of first stage and the negative capacitor array 310 of first stage. Next, an intermediate 4-bit binary value may be obtained by the binary search method using the positive capacitor array 220 of the second stage and the negative capacitor array 320 of the second stage. The method of obtaining the intermediate bit value may be performed by the binary search method using the positive capacitor array 220 of the second stage and the negative capacitor array 320 of the second stage, similar to the process of obtaining the upper bit value.

FIGS. 14 to 21 are views illustrating conversion operations for intermediate bits among conversion operations for 12 bits of the SAR ADC having a split-capacitor based DAC according to an embodiment of the present disclosure. Particularly, FIGS. 15, 17, 19, and 21 are views illustrating a process of determining a comparator output signal in the conversion operations for the intermediate bits of FIGS. 14, 16, 18, and 20. In FIGS. 14 to 21, the same reference numerals as those in FIG. 1 denote the same elements.

Figure 14:
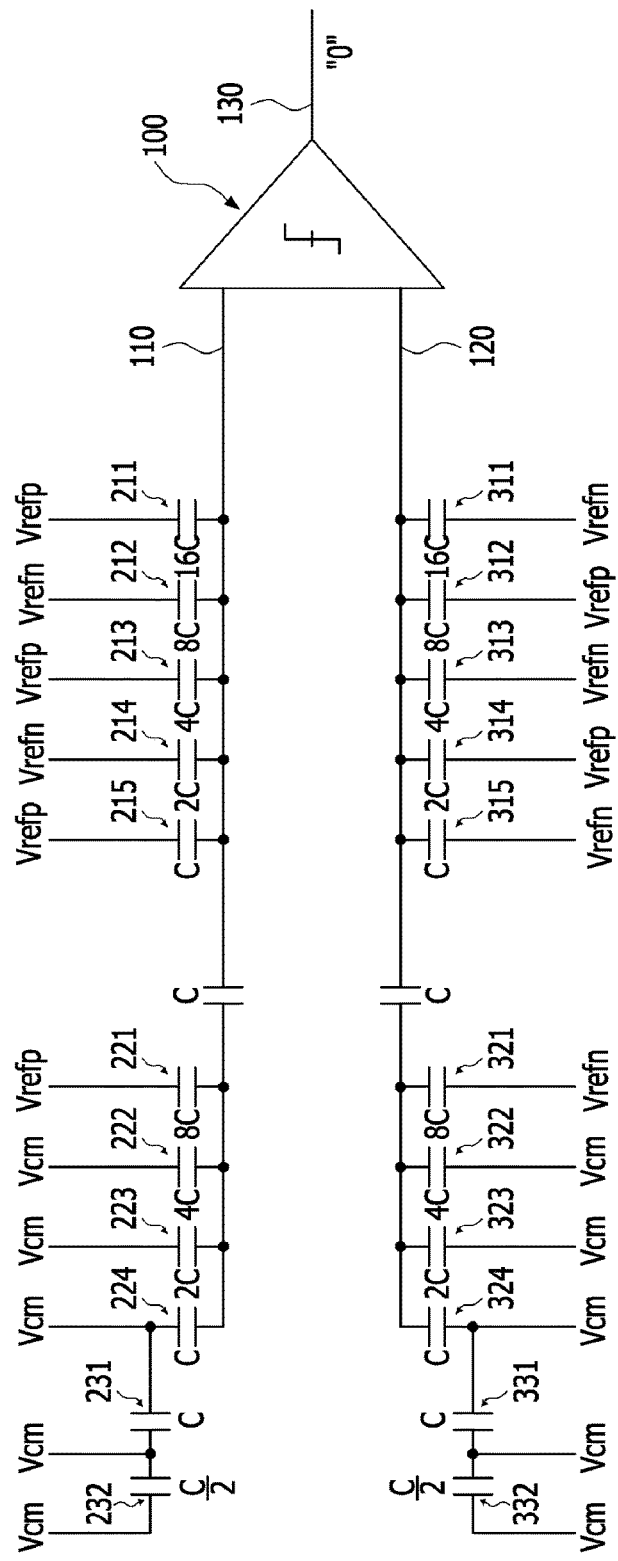
FIGS. 14 to 21 are views illustrating conversion operations for intermediate bits among 12-bit conversion operations of an SAR ADC including a split-capacitor based DAC according to an embodiment of the present disclosure.
Figure 15:
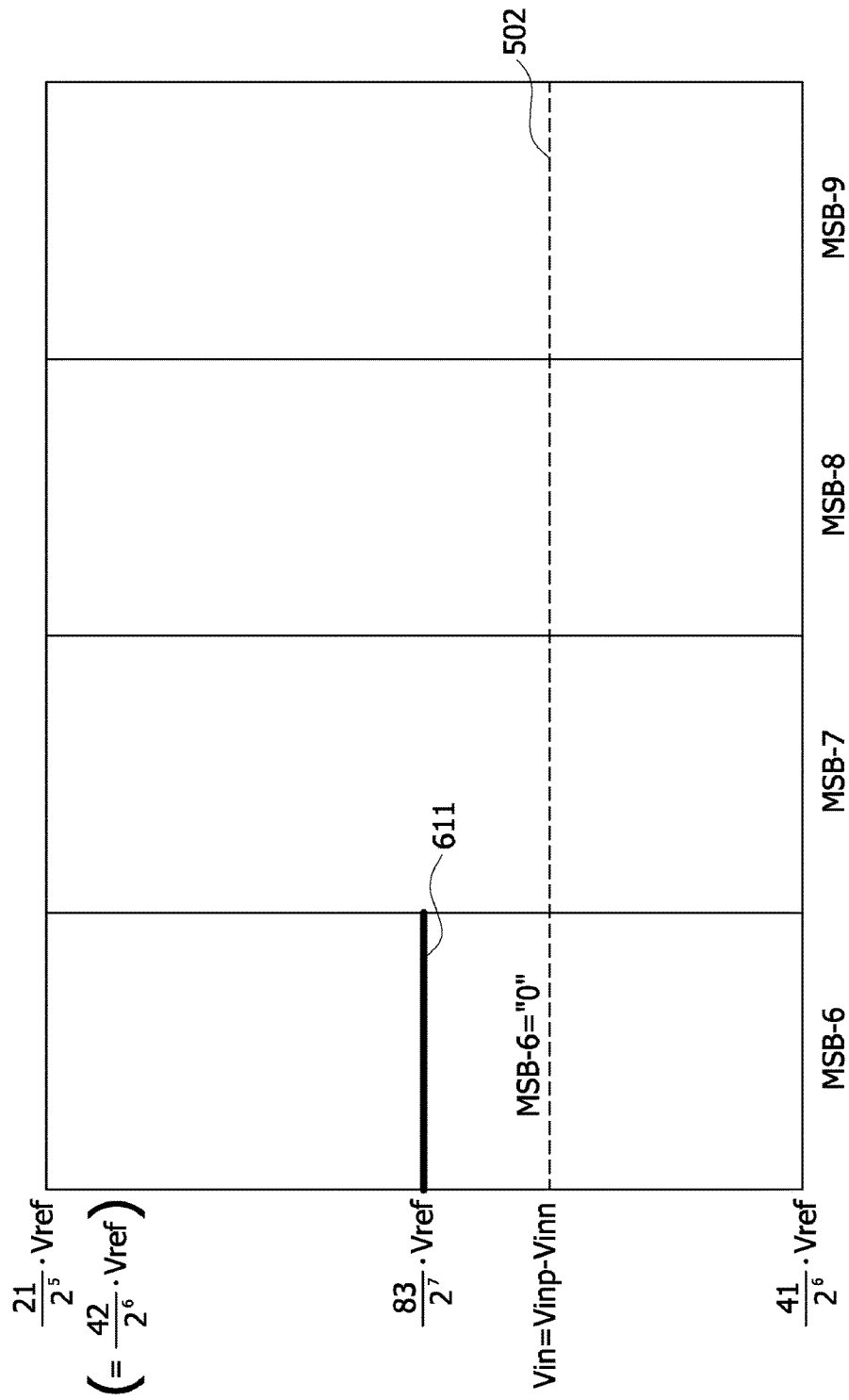

Referring to FIGS. 14 and 15, in order to obtain an (MSB-6) bit value for the analog input voltage Vin, the (MSB-5) bit value "1" outputted from the comparator 100 may be inputted to the SAR logic 400. The SAR logic 400 may provide a first switching control signal and a second switching control signal to the positive capacitor bank 200 and the negative capacitor bank 300, respectively, in response to the inputted output value "1" of the comparator 100. As in the above example, in the case that the (MSB-5) bit value outputted from the comparator 100 is "1", i.e., when the analog input voltage Vin is greater than the (MSB-5) bit reference voltage $(41/2^6)$*Vref, a first switching control signal and a second switching control signal are generated so that the (MSB-6) bit reference voltage is increased. In order to increase the (MSB-6) bit reference voltage, the first switching control signal may control the first reference voltage Vrefp to be applied to the second terminal of the first positive capacitor 221 of the second stage. In addition, the second switching control signal may control the second reference voltage Vrefn to be applied to the second terminal of the first negative capacitor 321 of the second stage.

As the first reference voltage Vrefp is applied to the second terminal of the first positive capacitor 221 of the second stage and the second reference voltage Vrefn is applied to the second terminal of the first negative capacitor 321 of the second stage, the (MSB-6) bit value may be determined by comparing the analog input voltage Vin with an (MSB-6) bit reference voltage. The (MSB-6) bit reference voltage may have a magnitude $(83/2^7)*Vref$ of an intermediate value between the (MSB-4) bit reference voltage $(21/2^5)*Vref$ and the (MSB-5) bit reference voltage $(41/2^6)*Vref$. As illustrated in FIG. 15, in the case that the analog input voltage Vin is less than the (MSB-6) bit reference voltage $(83/2^7)*Vref$, i.e., when the analog input voltage Vin indicated by the dotted line 502 is located below the (MSB-6) bit reference voltage $(83/2^7*Vref)$ indicated by the solid line 611, the comparator 100 may output "0" as the (MSB-6) bit value for the analog input voltage Vin.

Figure 16:
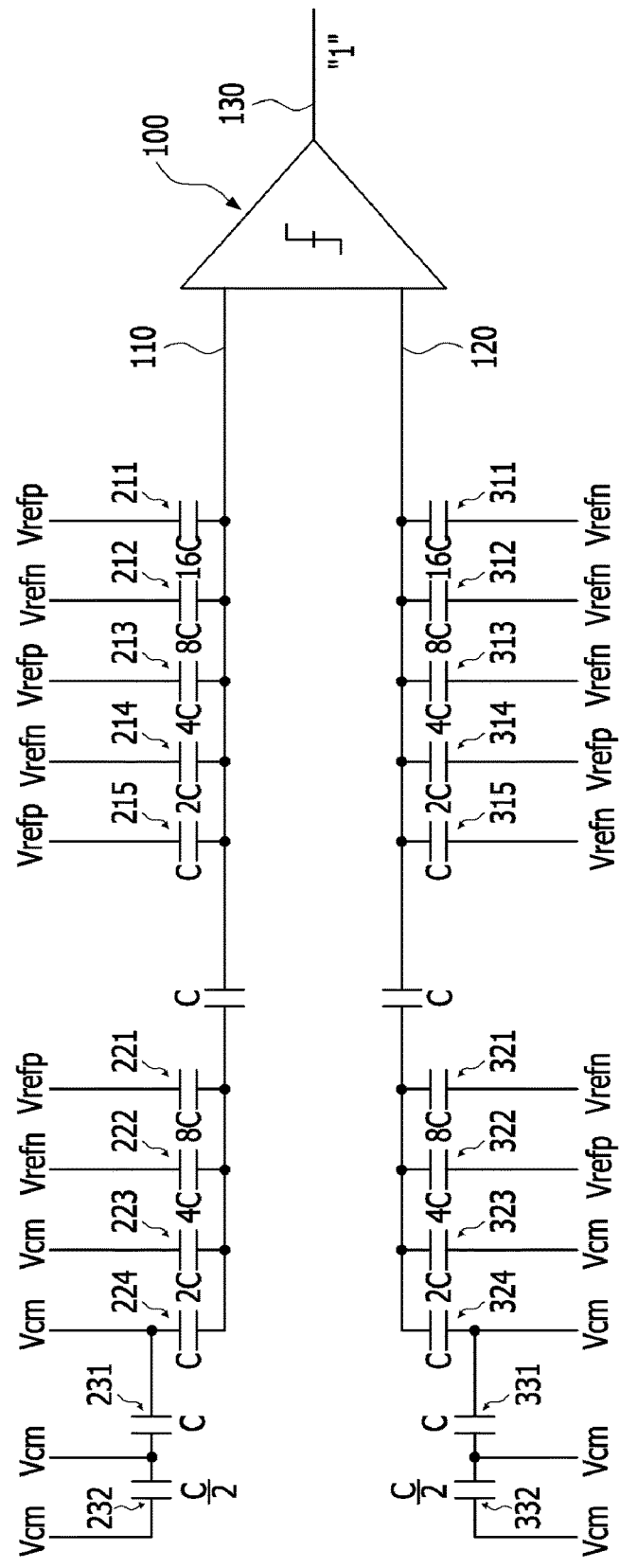
Figure 17:
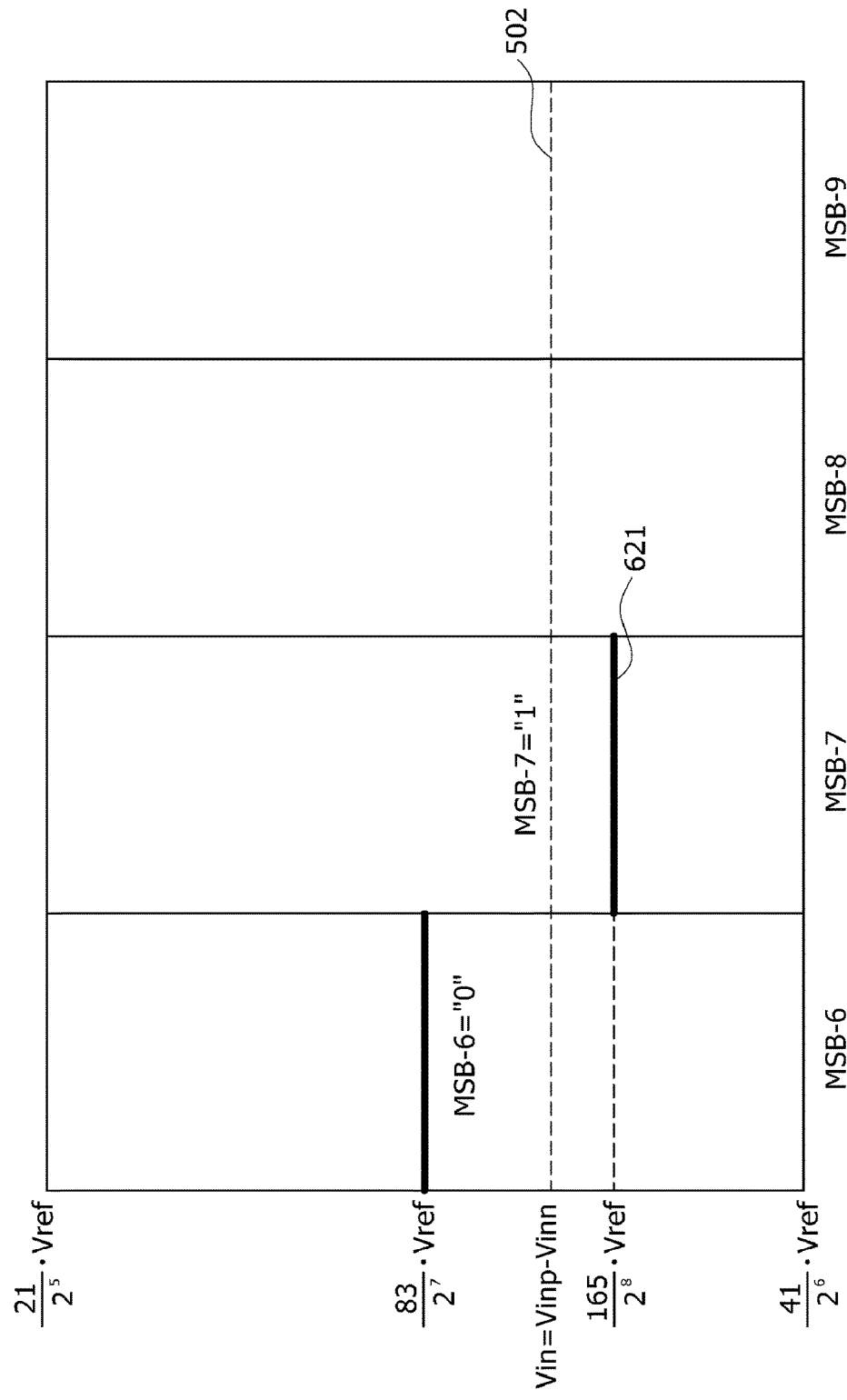

Referring to FIGS. 16 and 17, in order to obtain an (MSB-7) bit value for the analog input voltage Vin, the (MSB-6) bit value "0" outputted from the comparator 100 may be inputted to the SAR logic 400. The SAR logic 400 may provide a first switching control signal and a second switching control signal to the positive capacitor bank 200 and the negative capacitor bank 300, respectively, in response to the inputted output value "0" of the comparator 100. As in the above example, in the case that the (MSB-6) bit value outputted from the comparator 100 is "0", i.e., when the analog input voltage Vin is less than the (MSB-6) bit reference voltage $(83/2^7)*Vref$, a first switching control signal and a second switching control signal are generated so that the (MSB-7) bit reference voltage is decreased. In order to decrease the (MSB-7) bit reference voltage, the first switching control signal may control the second reference voltage Vrefn to be applied to the second terminal of the second positive capacitor 222 of the second stage. In addition, the second switching control signal may control the first reference voltage Vrefp to be applied to the second terminal of the second negative capacitor 322 of the second stage.

As the second reference voltage Vrefn is applied to the second terminal of the second positive capacitor 222 of the second stage and the first reference voltage Vrefp is applied to the second terminal of the second negative capacitor 322 of the second stage, the (MSB-7) bit value may be determined by comparing the analog input voltage Vin with a (MSB-7) bit reference voltage. The (MSB-7) bit reference voltage may have a magnitude $(165/2^8)*Vref$ of an intermediate value between the (MSB-5) bit reference voltage $(41/2^6)*Vref$ and the (MSB-6) bit reference voltage $(83/2^7)*Vref$. As illustrated in FIG. 17, in the case that the analog input voltage Vin is greater than the (MSB-7) bit reference voltage $(165/2^8)*Vref$, i.e., when the analog input voltage Vin indicated by the dotted line 502 is located above the (MSB-7) bit reference voltage $(165/2^8)*Vref$ indicated by the solid line 621, the comparator 100 may output "1" as the (MSB-7) bit value for the analog input voltage Vin.

Figure 18:
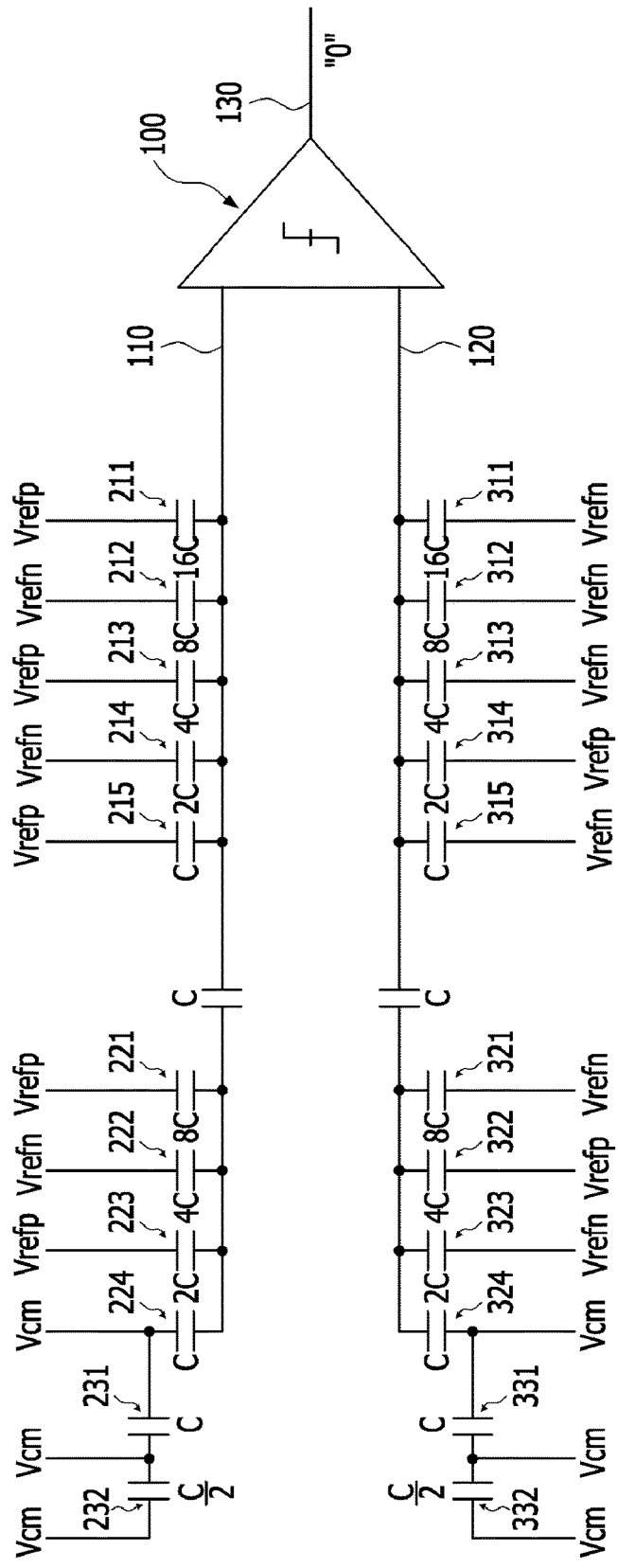
Figure 19:
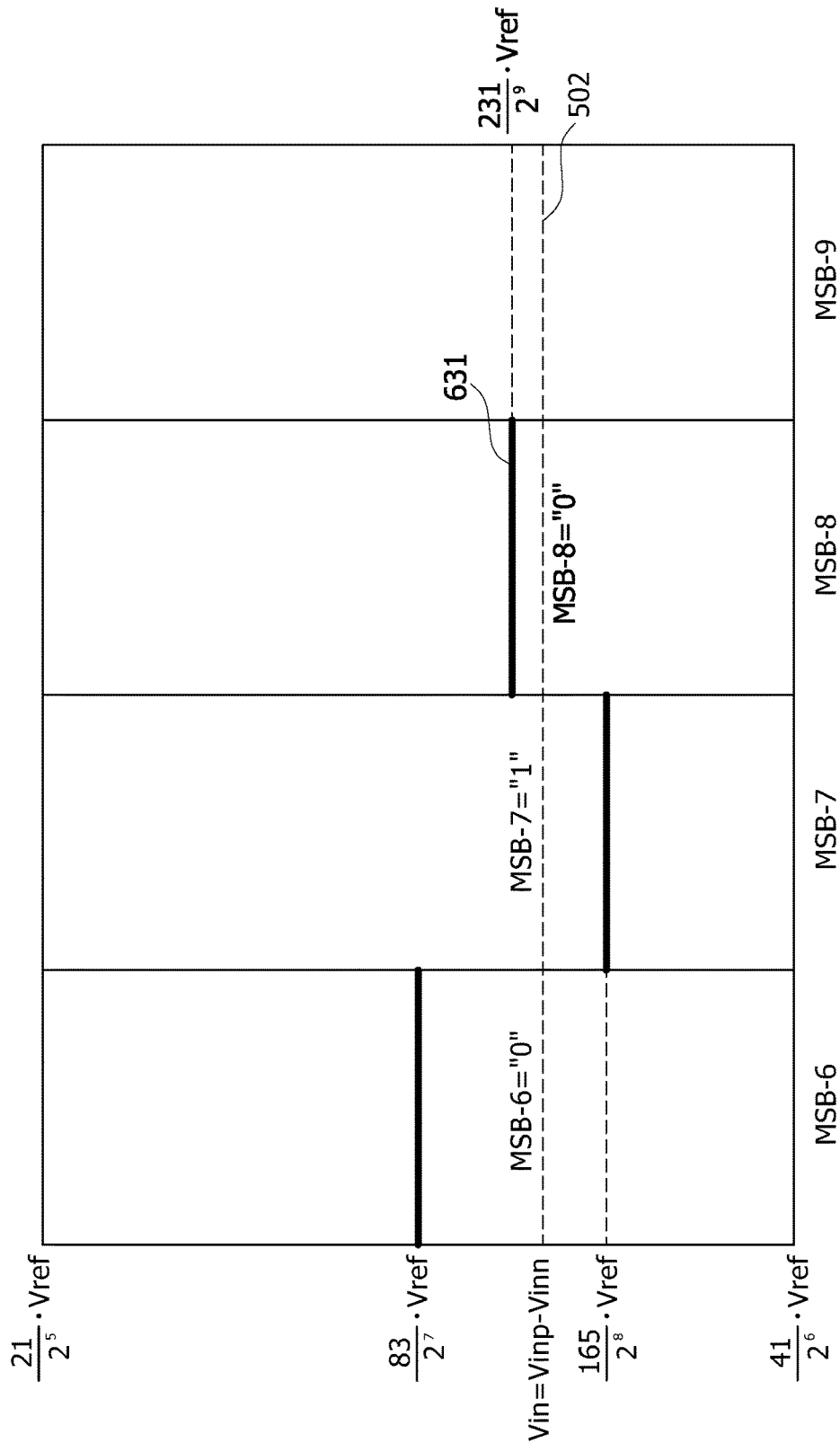

Referring to FIGS. 18 and 19, in order to obtain an (MSB-8) bit value for the analog input voltage Vin, the (MSB-7) bit value "1" outputted from the comparator 100 may be inputted to the SAR logic 400. The SAR logic 400 may provide a first switching control signal and a second switching control signal to the positive capacitor bank 200 and the negative capacitor bank 300, respectively, in response to the inputted output value "1" of the comparator 100. As in the above example, in the case that the (MSB-7) bit value outputted from the comparator 100 is "1", i.e., when the analog input voltage Vin is greater than the (MSB-7) bit reference voltage $(165/2^8)*Vref$, a first switching control signal and a second switching control signal are generated so that the (MSB-8) bit reference voltage is decreased. In order to decrease the (MSB-8) bit reference voltage, the first switching control signal may control the first reference voltage Vrefp to be inputted to the second terminal of the third positive capacitor 223 of the second stage. In addition, the second switching control signal may control the second reference voltage Vrefn to be inputted to the second terminal of the third negative capacitor 323 of the second stage.

As the first reference voltage Vrefp is applied to the second terminal of the third positive capacitor 223 of the second stage and the second reference voltage Vrefn is applied to the second terminal of the third negative capacitor 323 of the second stage, the (MSB-8) bit value may be determined by comparing the analog input voltage Vin with a (MSB-8) bit reference voltage. The (MSB-8) bit reference voltage may have a magnitude $(231/2^9)*Vref$ of an intermediate value between the (MSB-6) bit reference voltage $(83/2^7)*Vref$ and the (MSB-7) bit reference voltage $(165/2^8)*Vref$. As illustrated in FIG. 19, in the case that the analog input voltage Vin is less than the (MSB-8) bit reference voltage $(231/2^9)*Vref$, i.e., when the analog input voltage Vin indicated by the dotted line 502 is located below the (MSB-8) bit reference voltage $(231/2^9)*Vref$ indicated by the solid line 631, the comparator 100 may output "0" as the (MSB-8) bit value for the analog input voltage Vin.

Figure 20:
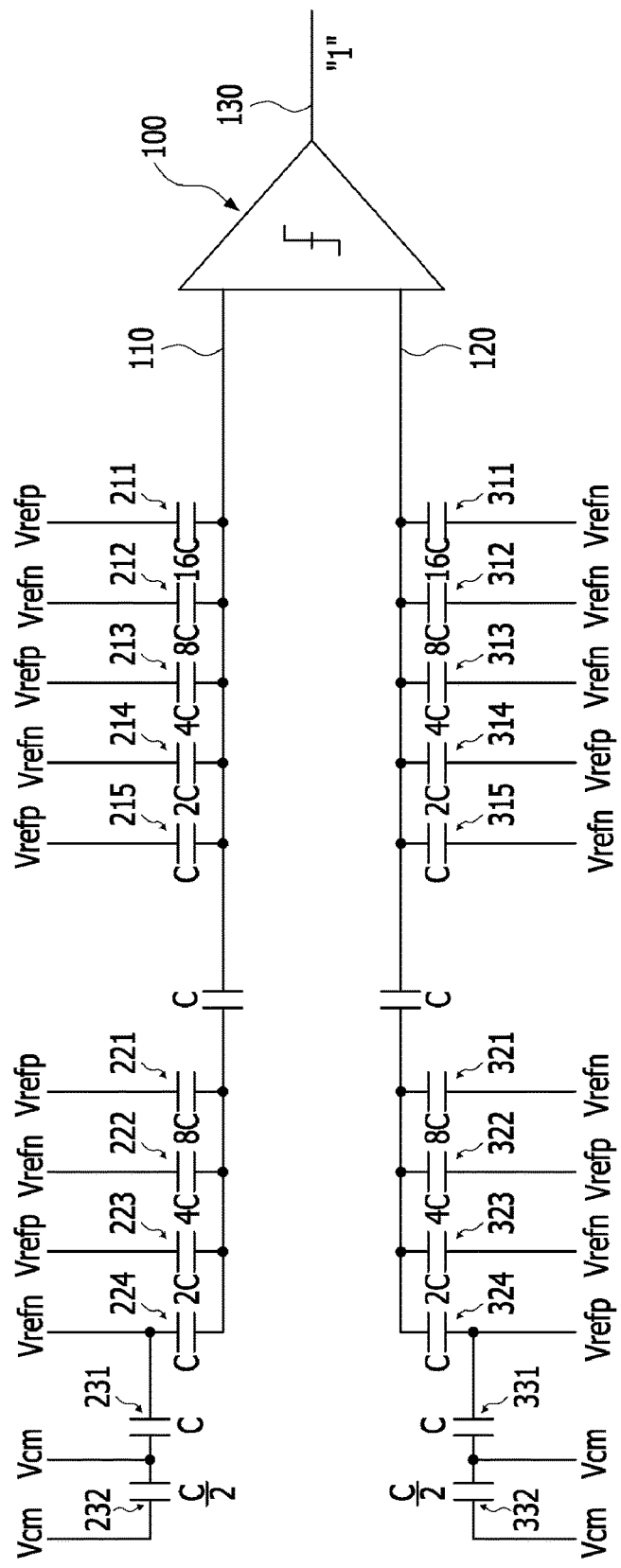
Figure 21:
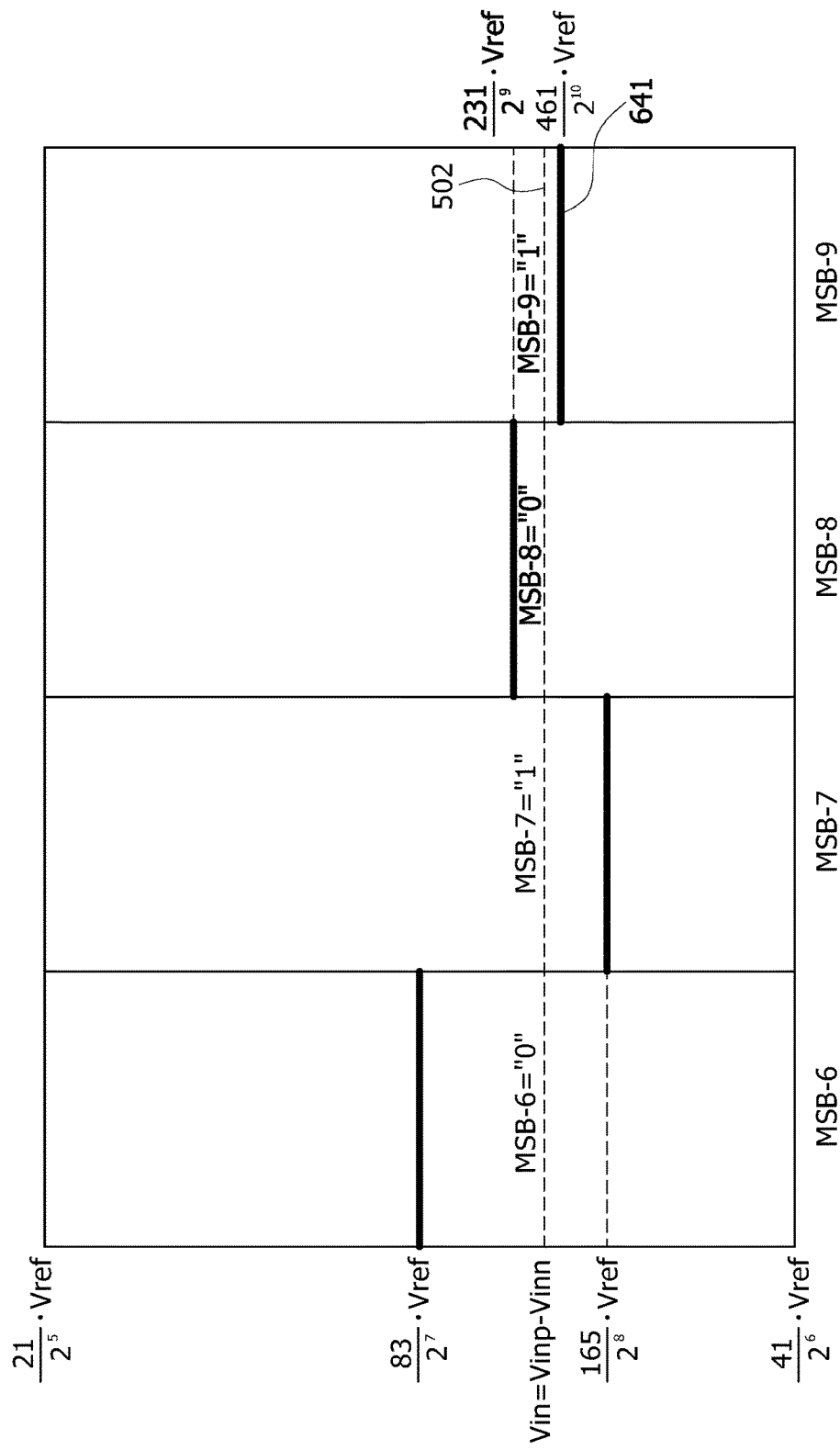

Referring to FIGS. 20 and 21, in order to obtain an (MSB-9) bit value for the analog input voltage Vin, the (MSB-8) bit value "0" outputted from the comparator 100 may be inputted to the SAR logic 400. The SAR logic 400 may provide a first switching control signal and a second switching control signal to the positive capacitor bank 200 and the negative capacitor bank 300, respectively, in response to the inputted output value "0" of the comparator 100. As in the above example, in the case that the (MSB-8) bit value outputted from the comparator 100 is "0", i.e., when the analog input voltage Vin is less than the (MSB-8) bit reference voltage $(231/2^9)*Vref$, the first switching control signal and the second switching control signal are generated so that the (MSB-9) bit reference voltage is decreased. In order to decrease the (MSB-9) bit reference voltage, the first switching control signal may control the second reference voltage Vrefn to be applied to the second terminal of the fourth positive capacitor 224 of the second stage. In addition, the second switching control signal may control the first reference voltage Vrefp to be applied to the second terminal of the fourth negative capacitor 324 of the second stage.

As the second reference voltage Vrefn is applied to the second terminal of the fourth positive capacitor 224 of the second stage and the first reference voltage Vrefp is applied to the second terminal of the fourth negative capacitor 324 of the second stage, the (MSB-9) bit value may be determined by comparing the analog input voltage Vin with an (MSB-9) bit reference voltage. The (MSB-9) bit reference voltage may have a magnitude $(461/2^{10})*Vref$ of an intermediate value between the (MSB-7) bit reference voltage $(165/2^8)$*Vref and the (MSB-8) bit reference voltage $(231/2^9)$*Vref. As illustrated in FIG. 21, in the case that the analog input voltage Vin is greater than the (MSB-9) bit reference voltage $(461/2^{10})$*Vref, i.e., when the analog input voltage Vin indicated by the dotted line 502 is located above the (MSB-9) bit reference voltage $(461/2^{10})$*Vref indicated by the solid line 641, the comparator 100 may output "1" as the (MSB-9) bit value for the analog input voltage Vin.

Up to now, after obtaining "101001" as binary values for the upper 6 bits including the MSB, "0101" were obtained as binary values of for the intermediate 4 bits through the binary search method using the positive capacitor array 220 of second stage and the negative capacitor array 320 of the second stage. Next, binary values for lower bits including the LSB and LSB previous bits can be obtained by the binary search method using the positive capacitor array 230 of the third stage and the negative capacitor array 330 of the third stage.

Figure 22:
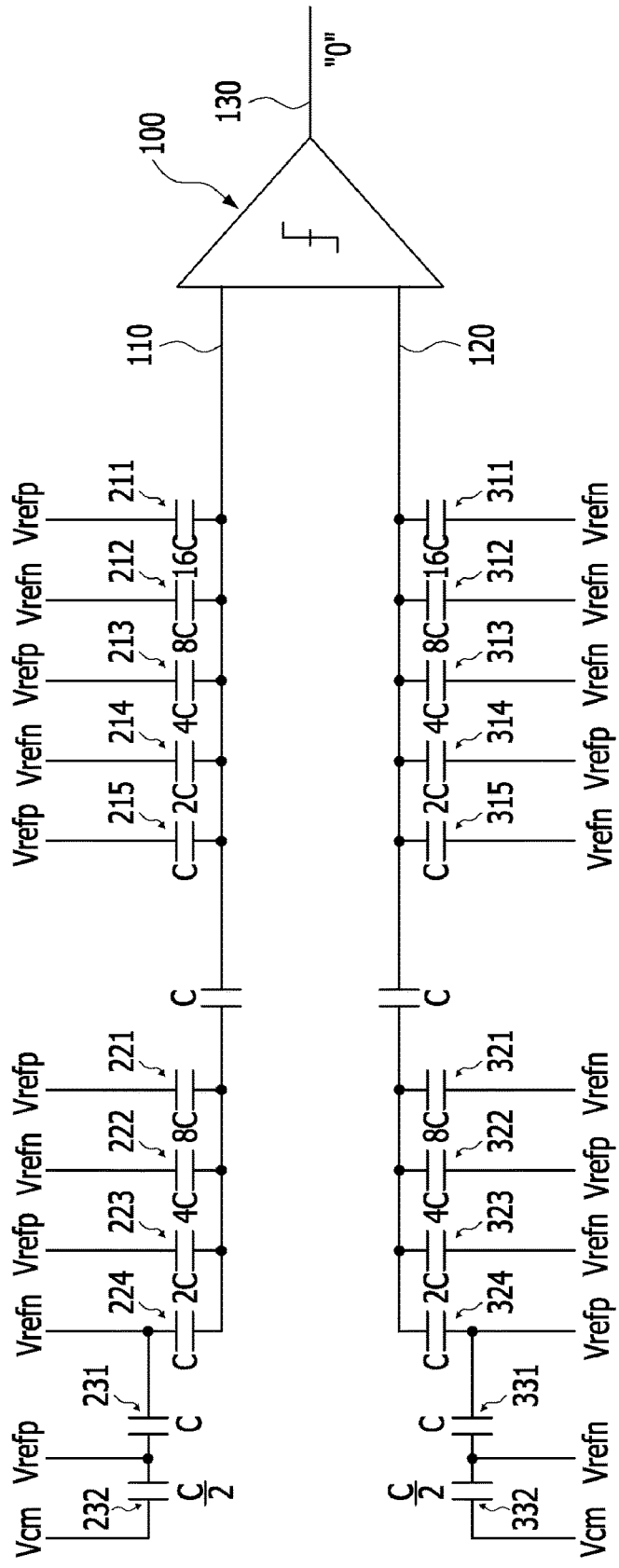
FIGS. 22 to 25 are views illustrating conversion operations for lower bits among 12-bit conversion operations of an SAR ADC including a split-capacitor based DAC according to an embodiment of the present disclosure.
Figure 23:
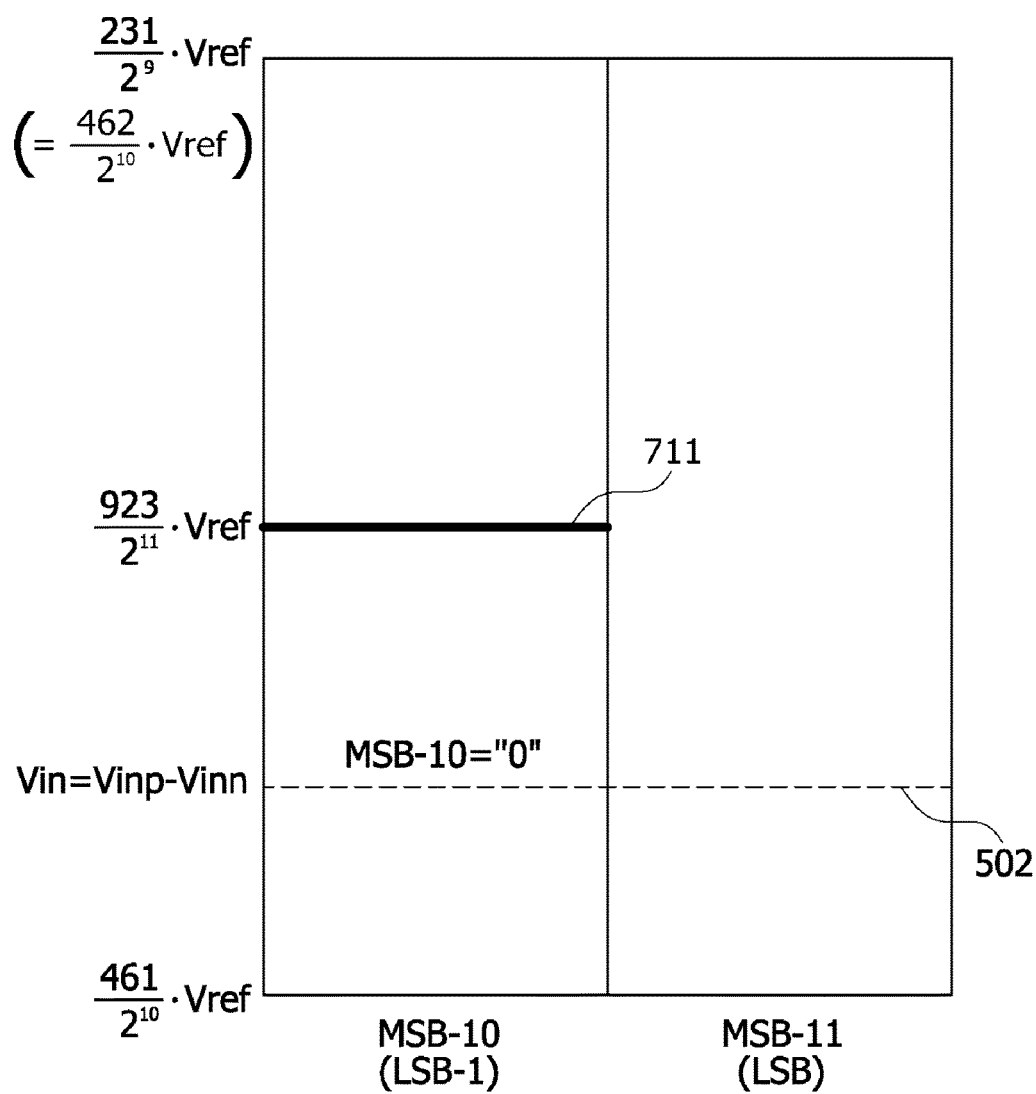
Figure 24:
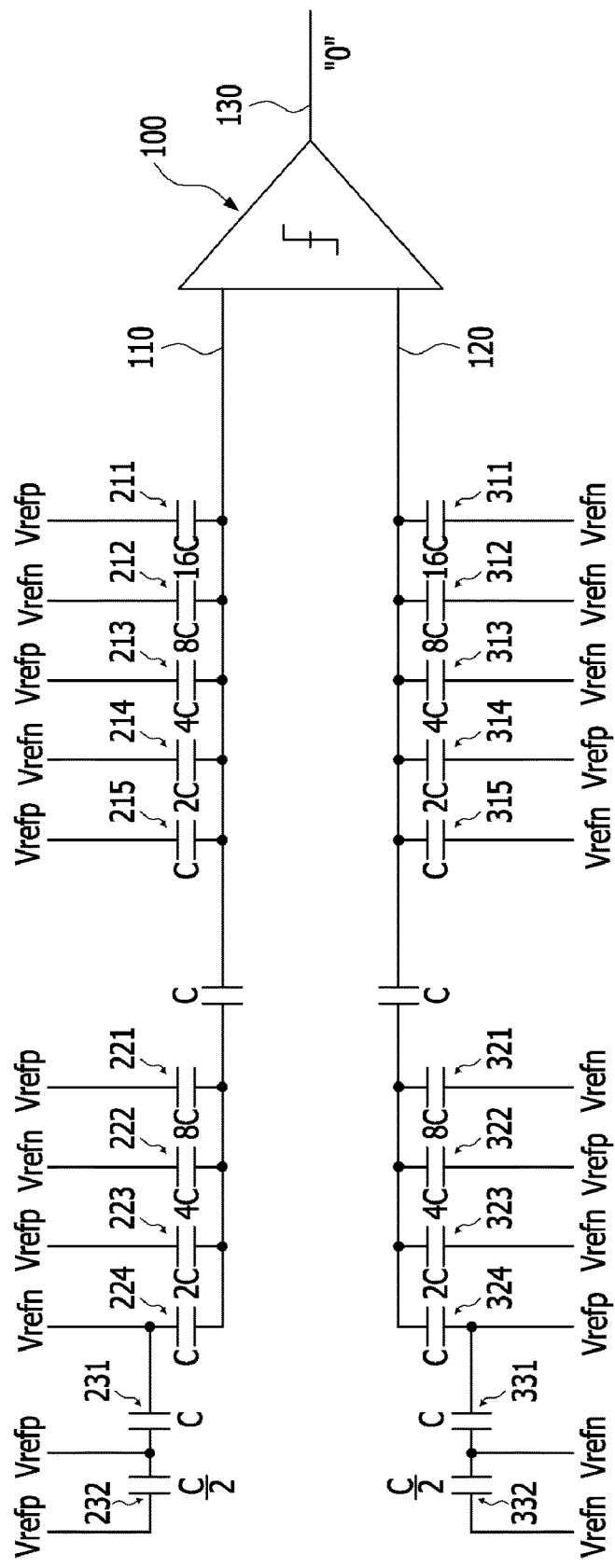
Figure 25:
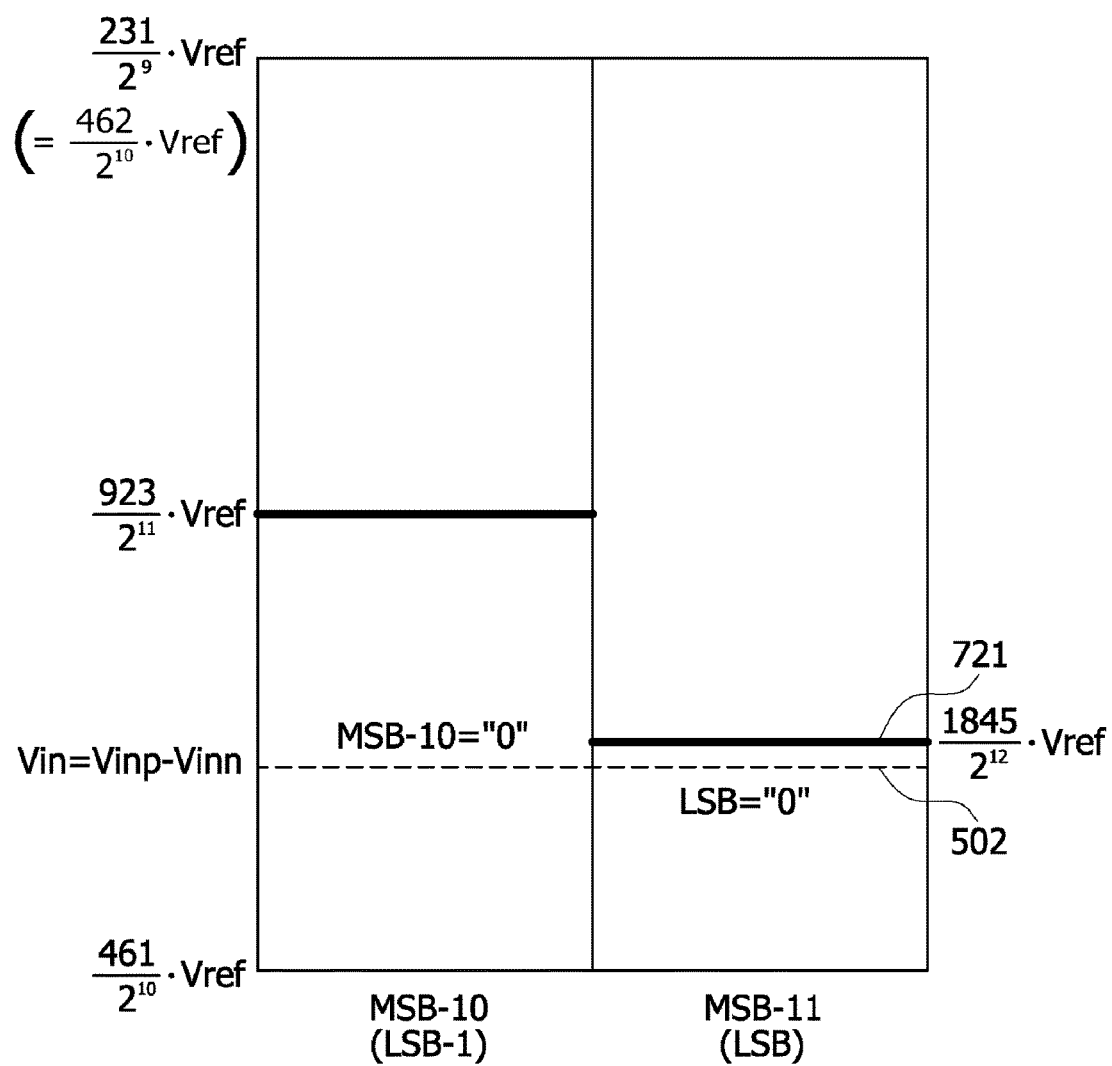

FIGS. 22 to 25 are views illustrating conversion operations for the lower bits among the conversion operations for 12 bits of the SAR ADC having a split-capacitor based DAC according to an embodiment of the present disclosure. Particularly, FIGS. 23 and 25 are views illustrating a process of determining comparator output signals for the conversion operations of the lower bits in FIGS. 22, and 24. In FIGS. 22 to 25, the same reference numerals as those in FIG. 1 denote the same elements.

Referring to FIGS. 22 and 23, in order to obtain an (MSB-10) bit value for the analog input voltage Vin, the (MSB-9) bit value "1" outputted from the comparator 100 may be inputted to the SAR logic 400. The SAR logic 400 may provide a first switching control signal and a second switching control signal to the positive capacitor bank 200 and the negative capacitor bank 300, respectively, in response to the inputted output value "1" of the comparator 100. As in the above example, in the case that the (MSB-9) bit value outputted from the comparator 100 is "1", i.e., when the analog input voltage Vin is greater than the (MSB-9) bit reference voltage $(461/2^{10})$*Vref, the first switching control signal and the second switching control signal are generated so that the (MSB-10) bit reference voltage is increased. In order to increase the (MSB-10) bit reference voltage, the first switching control signal may control the first reference voltage Vrefp to be applied to the second terminal of the first positive capacitor 231 of the third stage. In addition, the second switching control signal may control the second reference voltage Vrefn to be applied to the second terminal of the first negative capacitor 331 of the third stage.

As the first reference voltage Vrefp is applied to the second terminal of the first positive capacitor 231 of the third stage and the second reference voltage Vrefn is applied to the second terminal of the first negative capacitor 331 of the third stage, the (MSB-10) bit value may be determined by comparing the analog input voltage Vin with an (MSB-10) bit reference voltage. The (MSB-10) bit reference voltage may have a magnitude $(923/2^{11})$*Vref of an intermediate value between the (MSB-8) bit reference voltage $(231/2^9)$*Vref and the (MSB-9) bit reference voltage $(461/2^{10})$*Vref. As illustrated in FIG. 23, in the case that the analog input voltage Vin is less than the (MSB-10) bit reference voltage $(923/2^{11})$*Vref, i.e., when the analog input voltage Vin indicated by the dotted line 502 is located below the (MSB-10) bit reference voltage $(923/2^{11})$*Vref indicated by the solid line 711, the comparator 100 may output "0" as the (MSB-10) bit value for the analog input voltage Vin.

Referring to FIGS. 24 and 25, in order to obtain an (MSB-11) bit value for the analog input voltage Vin, the (MSB-10) bit value "0" outputted from the comparator 100 may be inputted to the SAR logic 400. The SAR logic 400 may provide a first switching control signal and a second switching control signal to the positive capacitor bank 200 and the negative capacitor bank 300, respectively, in response to the inputted output value "0" of the comparator 100. As in the above example, in the case that the (MSB-10) bit value outputted from the comparator 100 is "0", i.e., when the analog input voltage Vin is less than the (MSB-10) bit reference voltage $(923/2^{11})$*Vref, the first switching control signal and the second switching control signal are generated so that an LSB reference voltage is decreased. In order to decrease the LSB reference voltage, the first switching control signal may control the second reference voltage Vrefn to be applied to the second terminal of the second positive capacitor 232 of the third stage. In addition, the second switching control signal may control the first reference voltage Vrefp to be applied to the second terminal of the second negative capacitor 332 of the third stage.

As the second reference voltage Vrefn is applied to the second terminal of the second positive capacitor 232 of the third stage and the first reference voltage Vrefp is applied to the second terminal of the second negative capacitor 332 of the third stage, the LSB value may be determined by comparing the analog input voltage Vin with an LSB reference voltage. The LSB reference voltage may have a magnitude $(1845/2^{12})$*Vref of an intermediate value between the (MSB-9) bit reference voltage $(461/2^{10})$*Vref and the (MSB-10) bit reference voltage $(923/2^{11})$*Vref. As illustrated in FIG. 25, in the case that the analog input voltage Vin is less than the LSB reference voltage $(1845/2^{12})$*Vref, i.e., when the analog input voltage Vin indicated by the dotted line 502 is located below the LSB reference voltage $(1845/2^{12})$*Vref indicated by the solid line 721, the comparator 100 may output "0" as the LSB value for the analog input voltage Vin.

Accordingly, "00" is obtained as the binary value for the lower two bits including the LSB by using the positive capacitor array 230 of the third stage and the negative capacitor array 330 of the third stage. Therefore, the digital output data of 12 bits from the MSB to the LSB with respect to the analog input voltage Vin represents the value of "101001010100". Thus, according to the SAR ADC 10 having a split-capacitor based DAC according to this embodiment, a 10-bit ADC operation can be implemented by the positive capacitor array 210 of the first stage and the negative capacitor array 310 of the first stage, and the positive capacitor array 220 of the second stage and the negative capacitor array 320 of the second stage, and an ADC operation for the lower two bits of the LSB and LSB next bit can be additionally implemented by adding the positive capacitor array 230 of the third stage and the negative capacitor array 330 of the third stage. In other words, the output of 2 bits can be additionally increased from 10 bits by the positive capacitor array 230 of the third stage and the negative capacitor array 330 of the third stage, which is implemented with capacitors of the total capacitance of only 3 C, so that ENOB can be effectively increased.

The embodiments of the inventive concept have been disclosed above for illustrative purposes. Those of ordinary skill in the art will appreciate that various modifications, additions, and substitutions are possible, without departing from the scope and spirit of the inventive concept as disclosed in the accompanying claims.

What is claimed is:

1. A successive approximation register analog-digital converter including a split-capacitor based digital-analog converter, the successive approximation register analog-digital converter comprising:
    a comparator including a first input terminal and a second input terminal receiving a first input signal and a second input signal, respectively, and an output terminal generating an output signal;
    a split-capacitor based digital-analog converter including a positive capacitor bank generating the first input signal and a negative capacitor bank generating the second input signal; and
    a successive approximation register logic varying the first input signal from the positive capacitor bank and the second input signal from the negative capacitor bank in response to the output signal of the comparator,
    wherein each of the positive capacitor bank and the negative capacitor bank comprise:
    a positive capacitor array of a first stage and a negative capacitor array of a first stage that generate a first input signal and a second input signal used for conversion of upper bits including a most significant bit (MSB), respectively;
    a positive capacitor array of a second stage and a negative capacitor array of a second stage that are coupled to the positive capacitor array of the first stage and the negative capacitor array of the first stage through a first attenuation capacitor and a second attenuation capacitor, respectively, and generate a first input signal and a second input signal used for conversion of intermediate bits, respectively; and
    a positive capacitor array of a third stage and a negative capacitor array of a third stage that are coupled to the positive capacitor array of the second stage and the negative capacitor array of the second stage in series, respectively, and generate a first input signal and a second input signal used for conversion of lower least significant bits (LSB) and a bit next to the LSB, respectively,
    wherein the positive capacitor array of the first stage includes a plurality of positive capacitors of the first stage and the negative capacitor array of the first stage includes a plurality of positive capacitors of the first stage, and
    wherein when a number of upper bits to be extracted by the positive capacitor array of the first stage and the negative capacitor array of the first stage is "M", the number of positive capacitors of the first stage and the number of negative capacitors of the first stage are "M−1", respectively.

2. The successive approximation register analog-digital converter of claim 1, wherein the comparator includes an operational amplifier comparing the first input signal and the second input signal and outputting a binary value "1" or "0" according to a result of comparison.

3. The successive approximation register analog-digital converter of claim 1,
    wherein a first terminal of each of the positive capacitors of the first stage is coupled to the first input terminal of the comparator,
    a second terminal of each of the positive capacitors of the first stage is coupled to one of a first voltage apply line, a second voltage apply line, and a third voltage apply line through a positive switch of the first stage,
    a first terminal of each of the negative capacitors of the first stage is coupled to the second input terminal of the comparator, and
    a second terminal of each of the negative capacitors of the first stage is coupled to one of the first voltage apply line, second voltage apply line, and third voltage apply line through a negative switch of the first stage.

4. The successive approximation register analog-digital converter of claim 3, wherein a first reference voltage, a second reference voltage, and a common mode voltage are applied to the first voltage apply line, the second voltage apply line, and the third voltage apply line, respectively.

5. The successive approximation register analog-digital converter of claim 4,
    wherein the first reference voltage is greater than the second reference voltage, and
    the common mode voltage is an intermediate voltage between the first reference voltage and the second reference voltage.

6. The successive approximation register analog-digital converter of claim 3,
    wherein the positive capacitors of the first stage are arranged such that capacitances thereof are sequentially increased by two times from a positive capacitor having a unit capacitance to a positive capacitor having a greatest capacitance, and
    the negative capacitors of the first stage are arranged such that capacitances thereof are sequentially increased by two times from a negative capacitor having a unit capacitance to a negative capacitor having a greatest capacitance.

7. The successive approximation register analog-digital converter of claim 6,
    wherein the positive capacitor array of the first stage is configured such that a first input voltage is provided to a first terminal of the positive capacitor having the greatest capacitance among the positive capacitors of the first stage through a switching operation of the first input switch, and
    the negative capacitor array of the first stage is configured such that a second input voltage is provided to a first terminal of the negative capacitor having the greatest capacitance among the negative capacitors of the first stage through a switching operation of the second input switch.

8. The successive approximation register analog-digital converter of claim 7, wherein the first input switch and the second input switch are closed only during an MSB conversion process and maintain open states during a conversion process for remaining bits.

9. The successive approximation register analog-digital converter of claim 1, wherein the positive capacitor array of the second stage and the negative capacitor array of the second stage each includes a same number of positive capacitors of the second stage and negative capacitors of the second stage, respectively, as the number of bits of the intermediate bits.

10. The successive approximation register analog-digital converter of claim 9,
    wherein a first terminal of each of the positive capacitors of the second stage is coupled to the first input terminal of the comparator,
    a second terminal of each of the positive capacitors of the second stage is coupled to one of the first voltage apply line, the second voltage apply line, and the third voltage apply line through a positive switch of the second stage, a first terminal of each of the negative capacitors of the second stage is coupled to the second input terminal of the comparator, and a second terminal of each of the negative capacitors of the second stage is coupled to one of the first voltage apply line, the second voltage apply line, and the third voltage apply line through a negative switch of the second stage.

11. The successive approximation register analog-digital converter of claim 10, wherein the first terminal of each of the positive capacitors of the second stage is coupled to the first input terminal of the comparator through the positive attenuation capacitor, and the first terminal of each of the negative capacitors of the second stage is coupled to the second input terminal of the comparator through the negative attenuation capacitor.

12. The successive approximation register analog-digital converter of claim 11, wherein each of the positive attenuation capacitor, the negative attenuation capacitor, a positive capacitor having a smallest capacitance among the positive capacitors of the first stage, and a positive capacitor having a smallest capacitance among the positive capacitors of the second stage have a unit capacitance.

13. The successive approximation register analog-digital converter of claim 10, wherein a first reference voltage, a second reference voltage, and a common mode voltage are applied to the first voltage apply line, the second voltage apply line, and the third voltage apply line, respectively, the first reference voltage being greater than the second reference voltage, and the common mode voltage being an intermediate voltage between the first reference voltage and the second reference voltage.

14. The successive approximation register analog-digital converter of claim 10, wherein the positive capacitors of the second stage are arranged such that capacitances thereof are sequentially increased by two times from a positive capacitor having a unit capacitance to a positive capacitor having a greatest capacitance, and the negative capacitors of the second stage are arranged such that capacitances thereof are sequentially increased by two times from a negative capacitor having a unit capacitance to a negative capacitor having a greatest capacitance.

15. The successive approximation register analog-digital converter of claim 1, wherein the positive capacitor array of the third stage includes a positive capacitor of the third stage generating the first input signal used for conversion of the next bit of the LSB, and the second positive capacitor of the third stage generating the first input signal used for conversion of the LSB, and a negative capacitor array of the third stage includes a first negative capacitor of the third stage generating the second input signal used for conversion of the bit next to the LSB, and a second negative capacitor of the third stage generating the second input signal used for conversion of the LSB.

16. The successive approximation register analog-digital converter of claim 15, wherein a first terminal of the first positive capacitor of the third stage is coupled to a second terminal of the positive capacitor having a unit capacitance among the positive capacitors of the second stage, a second terminal of the first positive capacitor of the third stage is coupled to one of the first voltage apply line, the second voltage apply line, and the third voltage apply line through a first positive switch of the third stage, a first terminal of a second positive capacitor of the third stage is coupled to a second terminal of the first positive capacitor of the third stage, a second terminal of the second positive capacitor of the third stage is coupled to one of the first voltage apply line, the second voltage apply line, and the third voltage apply line through a second positive switch of the third stage, a first terminal of a first negative capacitor of the third stage is coupled to a second terminal of a negative capacitor having a unit capacitance among the negative capacitors of the second stage, a second terminal of the first negative capacitor of the third stage is coupled to one of the first voltage apply line, the second voltage apply line, and the third voltage apply line through a first negative switch of the third stage, a first terminal of the second negative capacitor of the third stage is coupled to a second terminal of the first negative capacitor of the third stage, and a second terminal of the second negative capacitor of the third stage is coupled to one of the first voltage apply line, the second voltage apply line, and the third voltage apply line through a second negative switch of the third stage.

17. The successive approximation register analog-digital converter of claim 16, wherein each of the first positive capacitor of the third stage and the first negative capacitor of the third stage has a unit capacitance, and each of the second positive capacitor of the third stage and the second negative capacitor of the third stage has a capacitance of a half the unit capacitance.

18. The successive approximation register analog-digital converter of claim 16, wherein a first reference voltage, a second reference voltage, and a common mode voltage are applied to the first voltage apply line, the second voltage apply line, and the third voltage apply line, respectively, the first reference voltage being greater than the second reference voltage, and the common mode voltage being an intermediated voltage between the first reference voltage and the second reference voltage.

* * * * *